United States Patent
Kozuma et al.

(10) Patent No.: US 9,397,637 B2
(45) Date of Patent: Jul. 19, 2016

(54) VOLTAGE CONTROLLED OSCILLATOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Munehiro Kozuma, Kanagawa (JP); Yoshiyuki Kurokawa, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/635,117

(22) Filed: Mar. 2, 2015

(65) Prior Publication Data
US 2015/0256156 A1 Sep. 10, 2015

(30) Foreign Application Priority Data
Mar. 6, 2014 (JP) .................................. 2014-043885

(51) Int. Cl.
*H03K 3/03* (2006.01)
*H03K 3/012* (2006.01)
(Continued)

(52) U.S. Cl.
CPC ............... *H03K 3/012* (2013.01); *H03K 3/0315* (2013.01); *H03L 7/0995* (2013.01); *H03L 7/14* (2013.01); *H03L 2207/08* (2013.01)

(58) Field of Classification Search
CPC .... H03K 3/0315; H03K 3/012; H03L 7/0995; H03L 2207/08; H03L 7/14
USPC .......................................................... 331/57
See application file for complete search history.

(56) References Cited

U.S. PATENT DOCUMENTS 5,594,391 A   1/1997  Yoshizawa
5,666,088 A * 9/1997  Penza .................... H03K 3/013
                                                         331/175

(Continued)

FOREIGN PATENT DOCUMENTS

EP    1737044 A    12/2006
EP    2226847 A    9/2010

(Continued)

OTHER PUBLICATIONS

Ofuji et al., "Fast Thin-Film Transistor Circuits Based on Amorphous Oxide Semiconductor", Electron Device Letters, IEEE 28.4 (2007): 273-275.*

(Continued)

*Primary Examiner* — Ryan Johnson
(74) *Attorney, Agent, or Firm* — Fish & Richardson P.C.

(57) ABSTRACT

A low-power voltage controlled oscillator is provided. The voltage controlled oscillator includes ($2n+1$) first circuit components (n is an integer of one or more). An output terminal of the first circuit component in a k-th stage (k is an integer of one or more and $2n$ or less) is connected to an input terminal of the first circuit component in a (k+1)-th stage. An output terminal of the first circuit component in a ($2n+1$)-th stage is connected to an input terminal of the first circuit component in a first stage. One of the first circuit components includes a second circuit component and a third circuit component whose input terminal is connected to an output terminal of the second circuit component. The third circuit component includes a first transistor and a second transistor whose source-drain resistance is controlled in accordance with a signal input to a gate through the first transistor.

24 Claims, 14 Drawing Sheets

(51) Int. Cl.
*H03L 7/099* (2006.01)
*H03L 7/14* (2006.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,154,098 A * | 11/2000 | Luo | H03L 7/0995 327/105 |
| 6,188,293 B1 * | 2/2001 | Miyagi | H03K 3/011 331/185 |
| 6,294,274 B1 | 9/2001 | Kawazoe et al. | |
| 6,504,439 B1 * | 1/2003 | Ozawa | H03K 3/0315 331/177 R |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,436,687 B2 * | 5/2013 | Aruga | H03K 3/354 331/135 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0149087 A1 * | 10/2002 | Okada | H03H 11/265 257/533 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0266010 A1 | 10/2008 | Endo | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2011/0101351 A1 | 5/2011 | Yamazaki | |
| 2013/0207102 A1 | 8/2013 | Miyake et al. | |
| 2013/0221344 A1 | 8/2013 | Ohmaru et al. | |
| 2013/0292669 A1 | 11/2013 | Tanabe et al. | |
| 2014/0340073 A1 | 11/2014 | Okamoto et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-310994 A | 11/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Roomt Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Later", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

30

VOLTAGE CONTROLLED OSCILLATOR, SEMICONDUCTOR DEVICE, AND ELECTRONIC DEVICE

BACKGROUND OF THE INVENTION

1. Field of the Invention

One embodiment of the present invention relates to a voltage controlled oscillator that can control the oscillation frequency of an output signal in accordance with the voltage of an input signal and a semiconductor device including the voltage controlled oscillator.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

A voltage controlled oscillator (VCO) generally includes a ring oscillator including a plurality of delay elements and a current source controlling the amount of current supplied to the delay element in accordance with voltage. In the voltage controlled oscillator, the oscillation frequency of an output signal is controlled by changing the delay time of a signal in the delay element in accordance with the amount of current supplied from the current source to the delay element.

Patent Document 1 discloses a voltage controlled oscillator in which a delay element including a depletion MOS transistor at an output end of an inverter is used (FIG. 6) and the delay time of rise or fall in an output signal of the inverter is controlled in accordance with the on resistance of the MOS transistor.

REFERENCE

Patent Document: Japanese Published Patent Application No. 06-310994

SUMMARY OF THE INVENTION

When the performance of an electronic device is evaluated, one of important points is low power consumption. Improving the power conversion efficiency of a voltage controlled oscillator leads to reduction in power consumption of a semiconductor device or an electronic device including the semiconductor device.

In view of the above technical background, an object of one embodiment of the present invention is to reduce the power consumption of a voltage controlled oscillator. Another object of one embodiment of the present invention is to reduce the power consumption of a semiconductor device including the voltage controlled oscillator.

Note that an object of one embodiment of the present invention is to provide a novel semiconductor device or the like. The description of these objects does not disturb the existence of other objects. In one embodiment of the present invention, there is no need to achieve all the objects. Other objects will be apparent from and can be derived from the description of the specification, the drawings, the claims, and the like.

A voltage controlled oscillator according to one embodiment of the present invention includes ($2n+1$) first circuit components (n is an integer of one or more). An output terminal of the first circuit component in a k-th stage (k is an integer of one or more and $2n$ or less) is connected to an input terminal of the first circuit component in a (k+1)-th stage. An output terminal of the first circuit component in a ($2n+1$)-th stage is connected to an input terminal of the first circuit component in a first stage. One of the first circuit components includes a second circuit component including any of an inverter, a NAND circuit, and a NOR circuit and a third circuit component whose input terminal is connected to an output terminal of the second circuit component. The third circuit component includes at least a first transistor and a second transistor whose source-drain resistance is controlled in accordance with a signal input to a gate through the first transistor.

In the voltage controlled oscillator according to one embodiment of the present invention, the first transistor may include a channel formation region in an oxide semiconductor film.

In the voltage controlled oscillator according to one embodiment of the present invention, the oxide semiconductor film may include indium (In), gallium (Ga), and zinc (Zn).

In one embodiment of the present invention, with the above structure, the power consumption of a voltage controlled oscillator can be reduced. Furthermore, in one embodiment of the present invention, the power consumption of a semiconductor device can be reduced with the use of the voltage controlled oscillator.

Note that one embodiment of the present invention can provide a novel semiconductor device or the like. The description of these effects does not disturb the existence of other effects. In one embodiment of the present invention, there is no need to obtain all the effects. Other effects will be apparent from and can be derived from the description of the specification, the drawings, the claims, and the like.

DETAILED DESCRIPTION OF THE INVENTION

Figure 1:
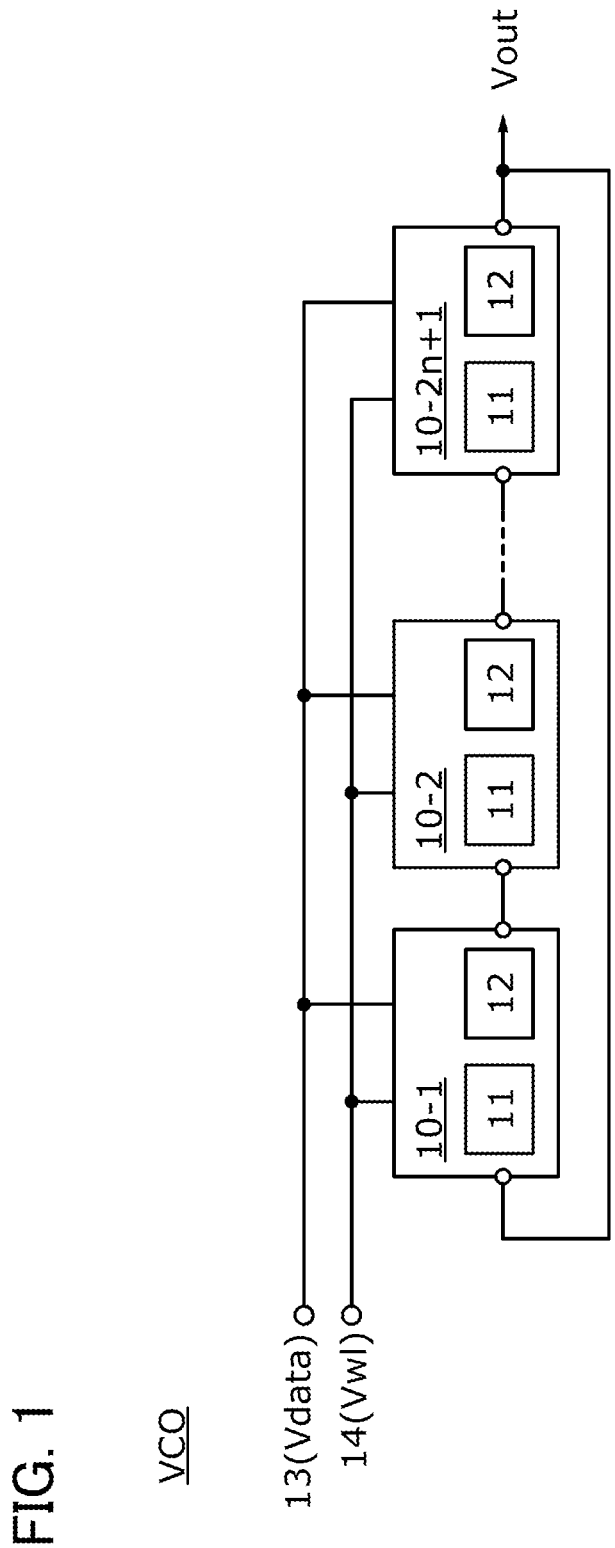
FIG. 1 is a block diagram illustrating the structure of a voltage controlled oscillator according to one embodiment of the present invention.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the present invention includes, in its category, all the semiconductor devices that include voltage controlled oscillators: for example, integrated circuits, radio frequency integrated circuits (RFIC), and semiconductor display devices. The integrated circuit includes, in its category, large scale integrated circuits (LSI) including a microprocessor, an image processing circuit, a digital signal processor (DSP), and a microcontroller and programmable logic devices (PLD) such as a field programmable gate array (FPGA) and a complex PLD (CPLD). Furthermore, the semiconductor display device includes, in its category, semiconductor display devices including voltage controlled oscillators, such as liquid crystal display devices, light-emitting devices in which a light-emitting element typified by an organic light-emitting element is provided in each pixel, electronic paper, digital micromirror devices (DMD), plasma display panels (PDP), and field emission displays (FED).

A source of a transistor means a source region that is part of a semiconductor film functioning as an active layer or a source electrode that is connected to the semiconductor film. Similarly, a drain of a transistor means a drain region that is part of the semiconductor film or a drain electrode that is connected to the semiconductor film. A gate means a gate electrode.

The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. Furthermore, in a p-channel transistor, a terminal to which a low potential is applied is called a drain, and a terminal to which a high potential is applied is called a source. In this specification, although the connection relationship of the transistor is described assuming that the source and the drain are fixed in some cases for convenience, actually, the names of the source and the drain interchange with each other depending on the relationship of the potentials.

In this specification, in the case where a potential is at a high level (High or H level), the potential is gate voltage (the potential of a gate electrode when a source electrode is used as a reference) high enough in a positive direction to bring a drain electrode and a source electrode of an n-channel transistor into conduction. In this specification, in the case where a potential is at a high level, the potential is gate voltage high enough in a positive direction to bring a drain electrode and a source electrode of a p-channel transistor out of conduction. In this specification, in the case where a potential is at a low level (Low or L level), the potential is gate voltage high enough in a negative direction to bring a drain electrode and a source electrode of an n-channel transistor out of conduction. In this specification, in the case where a potential is at a low level, the potential is gate voltage high enough in a negative direction to bring a drain electrode and a source electrode of a p-channel transistor into conduction.

Note that in one embodiment of the present invention, a digital logic circuit such as an inverter, a NAND circuit (NAND), or a NOR circuit (NOR) is used in some cases. In this specification, an inverter, a NAND circuit, and a NOR circuit mean a logical NOT circuit, a negative AND circuit, and a negative OR circuit, respectively.

<First Structure Example of Voltage Controlled Oscillator>

FIG. 1 illustrates a structure example of a voltage controlled oscillator according to one embodiment of the present invention. A voltage controlled oscillator VCO in FIG. 1 includes $(2n+1)$ first circuit components 10-1 to 10-2n+1 (n is an integer of one or more) (a first circuit component 10 or first circuit components 10).

An output terminal of one of the $(2n+1)$ first circuit components 10 in a stage other the final stage is electrically connected to an input terminal of the first circuit component 10 in a subsequent stage. An output terminal of the first circuit component 10 in the final stage is electrically connected to an input terminal of the first circuit component 10 in a first stage. In other words, an output terminal of the first circuit component 10-k in a k-th stage (k is an integer of one or more and $2n$ or less) is electrically connected to an input terminal of the first circuit component 10-k+1 in a (k+1)-th stage. An output terminal of the first circuit component 10-2n+1 in a $(2n+1)$-th stage is electrically connected to an input terminal of the first circuit component 10-1 in the first stage.

The potential of the output terminal of the first circuit component 10-2n+1 in the $(2n+1)$-th stage is output from the voltage controlled oscillator VCO as an output signal Vout.

The first circuit component 10 includes a second circuit component 11 and a third circuit component 12. The second circuit component 11 has a function of performing logical operation in a period during which power supply voltage is supplied and functions of inverting the polarity of the potential of an input signal and outputting the signal. A circuit component whose signal delay time varies depending on the level of supplied power supply voltage can be used as the second circuit component 11.

Specifically, an inverter, a NAND, a NOR, or the like can be used as the second circuit component 11. In the case where a NAND is used as the second circuit component 11, a potential corresponding to a logical value "1" can be input to one of two input terminals of the NAND, and a potential input from the input terminal of the first circuit component 10 can be input to the other of the two input terminals of the NAND. In the case where a NOR is used as the second circuit component 11, a potential corresponding to a logical value "0" can be input to one of two input terminals of the NOR, and a potential input from the input terminal of the first circuit component 10 can be input to the other of the two input terminals of the NOR.

A circuit component whose delay time is controlled in accordance with the potential of a signal Vdata input to the first circuit component 10 through a wiring 13 can be used as the third circuit component 12. Specifically, the third circuit component 12 includes at least a transistor whose source-drain resistance is controlled in accordance with the signal Vdata input to a gate and a transistor that controls the supply of the signal Vdata to the gate of the transistor in accordance with a signal Vw1 input to the first circuit component 10 through a wiring 14.

Figure 2A:
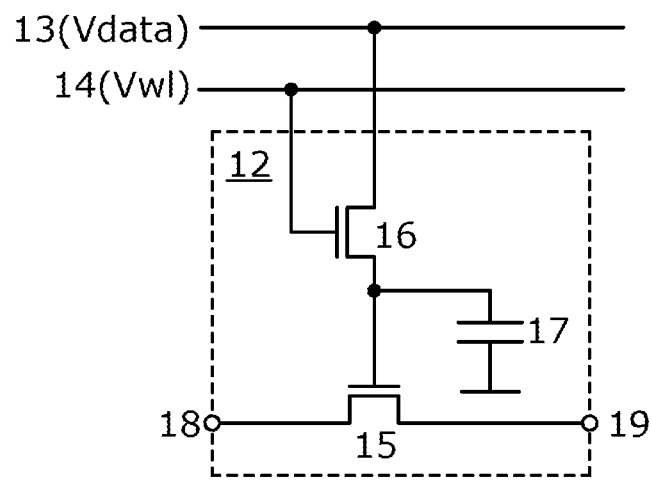
FIGS. 2A and 2B are circuit diagrams each illustrating the structure of a third circuit component according to one embodiment of the present invention.

FIG. 2A illustrates a specific structure example of the third circuit component 12. The third circuit component 12 in FIG. 2A includes a transistor 15, a transistor 16, and a capacitor 17. A gate of the transistor 16 is electrically connected to the wiring 14. One of a source and a drain of the transistor 16 is electrically connected to the wiring 13, and the other of the source and the drain of the transistor 16 is electrically connected to a gate of the transistor 15. One of a source and a drain of the transistor 15 is electrically connected to an input terminal 18, and the other of the source and the drain of the transistor 15 is electrically connected to an output terminal 19.

One electrode of the capacitor 17 is electrically connected to the gate of the transistor 15, and the other electrode of the capacitor 17 is electrically connected to a wiring (not illustrated) to which a predetermined potential is supplied.

In the third circuit component 12 in FIG. 2A, for example, in the case where the transistors 15 and 16 are n-channel transistors, when the potential of the signal Vw1 supplied to the wiring 14 is at a high level, the transistor 16 is turned on, and the potential of the signal Vdata input to the wiring 13 is supplied to the gate of the transistor 15 through the transistor 16. Note that actually, in the case where the transistor 16 is an n-channel transistor, the potential of the signal Vdata is decreased by the threshold voltage of the transistor 16 and is supplied to the gate of the transistor 15.

The source-drain resistance of the transistor 15 is controlled in accordance with the potential supplied to the gate of the transistor 15. Note that the signal delay time between the input terminal 18 and the output terminal 19 becomes longer as the resistance of the transistor 15 becomes higher, and the signal delay time between the input terminal 18 and the output terminal 19 becomes shorter as the resistance of the transistor 15 becomes lower. Thus, in the third circuit component 12, the signal delay time between the input terminal 18 and the output terminal 19 is controlled in accordance with the potential of the signal Vdata. Accordingly, the voltage controlled oscillator VCO including the third circuit component 12 in FIG. 2A can control the oscillation frequency of the output signal Vout in accordance with the potential of the signal Vdata.

Figure 2B:
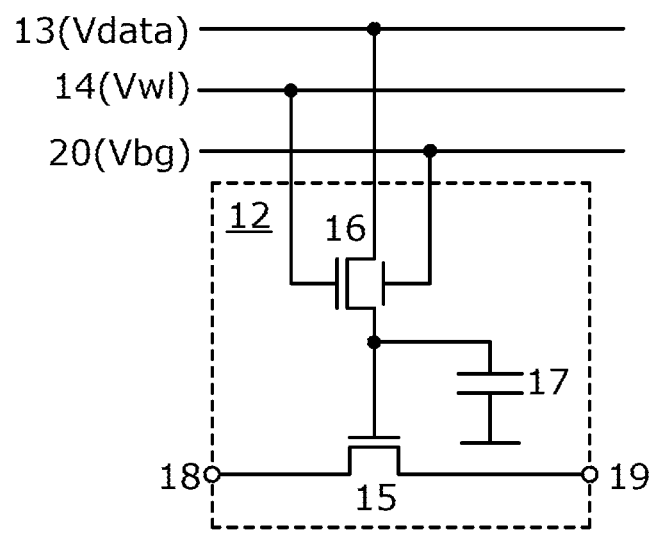

FIG. 2B illustrates a specific structure example of the third circuit component 12 that is different from the specific structure example in FIG. 2A. The third circuit component 12 in FIG. 2B includes the transistor 15, the transistor 16, and the capacitor 17 as in the third circuit component 12 in FIG. 2A. Note that the structure of the third circuit component 12 in FIG. 2B differs from the structure of the third circuit component 12 in FIG. 2A in that the transistor 16 has another gate that overlaps with the gate with a semiconductor film positioned therebetween, in addition to the gate to which the signal Vw1 is input. The other gate of the transistor 16 is referred to as a back gate in the following description.

Specifically, the gate of the transistor 16 is electrically connected to the wiring 14, and the back gate of the transistor 16 is electrically connected to a wiring 20 to which a signal Vbg is supplied. One of the source and the drain of the transistor 16 is electrically connected to the wiring 13, and the other of the source and the drain of the transistor 16 is electrically connected to the gate of the transistor 15. One of the source and the drain of the transistor 15 is electrically connected to the input terminal 18, and the other of the source and the drain of the transistor 15 is electrically connected to the output terminal 19.

One electrode of the capacitor 17 is electrically connected to the gate of the transistor 15, and the other electrode of the capacitor 17 is electrically connected to a wiring (not illustrated) to which a predetermined potential is supplied.

As in the third circuit component 12 in FIG. 2A, the third circuit component 12 in FIG. 2B can control supply of the potential of the signal Vdata to the gate of the transistor 15 in accordance with the potential of the signal Vw1. In addition, the third circuit component 12 in FIG. 2B can control the signal delay time between the input terminal 18 and the output terminal 19 in accordance with the potential of the signal Vdata. Thus, as in the voltage controlled oscillator VCO including the third circuit component 12 in FIG. 2A, the voltage controlled oscillator VCO including the third circuit component 12 in FIG. 2B can control the oscillation frequency of the output signal Vout in accordance with the potential of the signal Vdata.

In addition, the third circuit component 12 in FIG. 2B can control the threshold voltage of the transistor 16 by adjusting the potential of the signal Vbg. Thus, for example, when the transistor 16 is off, by adjusting the potential of the signal Vbg, the third circuit component 12 in FIG. 2B can shift the threshold voltage of the transistor 16 in a positive direction when the transistor 16 is an n-channel transistor and can shift the threshold voltage of the transistor 16 in a negative direction when the transistor 16 is a p-channel transistor. Such a structure can prevent leakage of electric charge from the gate of the transistor 15 through the transistor 16.

Note that the transistor 16 in each of the third circuit components 12 in FIGS. 2A and 2B preferably has extremely low off-state current because the transistor 16 has a function of holding the potential of the gate of the transistor 15. A transistor in which a channel formation region is formed in a film of a semiconductor with a wider bandgap and lower intrinsic carrier density than silicon can have extremely low off-state current and thus is preferably used as the transistor 16. Examples of such a semiconductor are an oxide semiconductor and gallium nitride whose bandgap is 2 or more times that of silicon. A transistor including the semiconductor can have significantly lower off-state current than a transistor including a normal semiconductor such as silicon or germanium. Consequently, the use of the transistor 16 having the above structure can prevent leakage of electric charge held in the gate of the transistor 15.

Thus, in the case where the off-state current of the transistor 16 is extremely low, the voltage controlled oscillator VCO according to one embodiment of the present invention can hold the potential of the gate of the transistor 15 for a long time. Accordingly, in the case where the oscillation frequency of the signal Vout does not need to be changed, the frequency of supply of the signal Vdata to the gate of the transistor 15 can be reduced. Consequently, in the voltage controlled oscillator VCO according to one embodiment of the present invention, power consumed by the supply of the signal Vdata can be reduced.

In the voltage controlled oscillator VCO in FIG. 1, the first circuit component 10 includes the second circuit component 11 and the third circuit component 12. Note that in the voltage controlled oscillator VCO according to one embodiment of the present invention, not all the first circuit components 10 need to include the third circuit components 12, and at least one of the first circuit components 10 may include the third circuit component 12.

The voltage controlled oscillator VCO according to one embodiment of the present invention may further include a circuit component having a function of controlling whether to output the output signal Vout from the voltage controlled oscillator. A NAND or a NOR can be used as the circuit component, for example.

For example, in the case where a NAND is used as the circuit component for controlling whether to output the output signal Vout, $2n$ first circuit components 10 are provided in the voltage controlled oscillator VCO. An output terminal of the first circuit component 10-$2n$ in a $2n$-th stage may be electrically connected to one of two input terminals of the NAND, and an output terminal of the NAND may be electrically connected to the input terminal of the first circuit component 10-1 in the first stage. In that case, oscillation of the output signal Vout can be stopped by setting the logical value of a signal input to the other of the two input terminals of the NAND to "0." Furthermore, the output signal Vout can be oscillated by setting the logical value of the signal input to the other of the two input terminals of the NAND to "1."

In the case where a NOR is used as the circuit component for controlling whether to output the output signal Vout, $2n$ first circuit components 10 are provided in the voltage controlled oscillator VCO. The output terminal of the first circuit component 10-$2n$ in the $2n$-th stage may be electrically connected to one of two input terminals of the NOR, and an output terminal of the NOR may be electrically connected to the input terminal of the first circuit component 10-1 in the first stage. In that case, the oscillation of the output signal Vout can be stopped by setting the logical value of a signal input to the other of the two input terminals of the NOR to "1." Furthermore, the output signal Vout can be oscillated by setting the logical value of the signal input to the other of the two input terminals of the NOR to "0."

Figure 3:
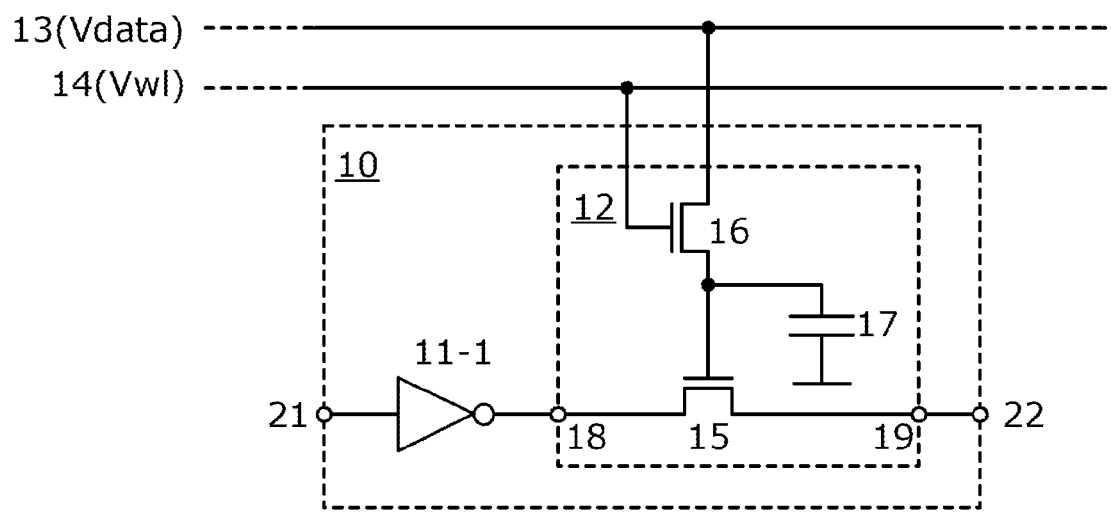
FIG. 3 is a circuit diagram illustrating the structure of a first circuit component according to one embodiment of the present invention.

Next, FIG. 3 illustrates a structure example of the first circuit component 10 when an inverter 11-1 is used as the second circuit component 11 and the third circuit component 12 has the structure in FIG. 2A.

In the first circuit component 10 in FIG. 3, a signal from an input terminal 21 of the first circuit component 10 is input to an input terminal of the inverter 11-1. An output terminal of the inverter 11-1 is electrically connected to the input terminal 18 of the third circuit component 12. The output terminal 19 of the third circuit component 12 is electrically connected to an output terminal 22 of the first circuit component 10.

Note that in the case of the first circuit component 10 in FIG. 3, the input terminal of the inverter 11-1 can be regarded as the input terminal 21 of the first circuit component 10. In addition, in the case of the first circuit component 10 in FIG. 3, the output terminal 19 of the third circuit component 12 can be regarded as the output terminal 22 of the first circuit component 10.

FIG. 3 illustrates an example in which the third circuit component 12 is electrically connected to the next stage of the inverter 11-1 that is the second circuit component 11. Note that in the voltage controlled oscillator VCO according to one embodiment of the present invention, in the first circuit component 10, the second circuit component 11 may be electrically connected to the next stage of the third circuit component 12. In that case, a signal from the input terminal 21 of the first circuit component 10 is input to the input terminal of the third circuit component 12, and the output terminal of the third circuit component 12 is electrically connected to an input terminal of the second circuit component 11. An output terminal of the second circuit component 11 is electrically connected to an output terminal 22 of the first circuit component 10.

Figure 8:
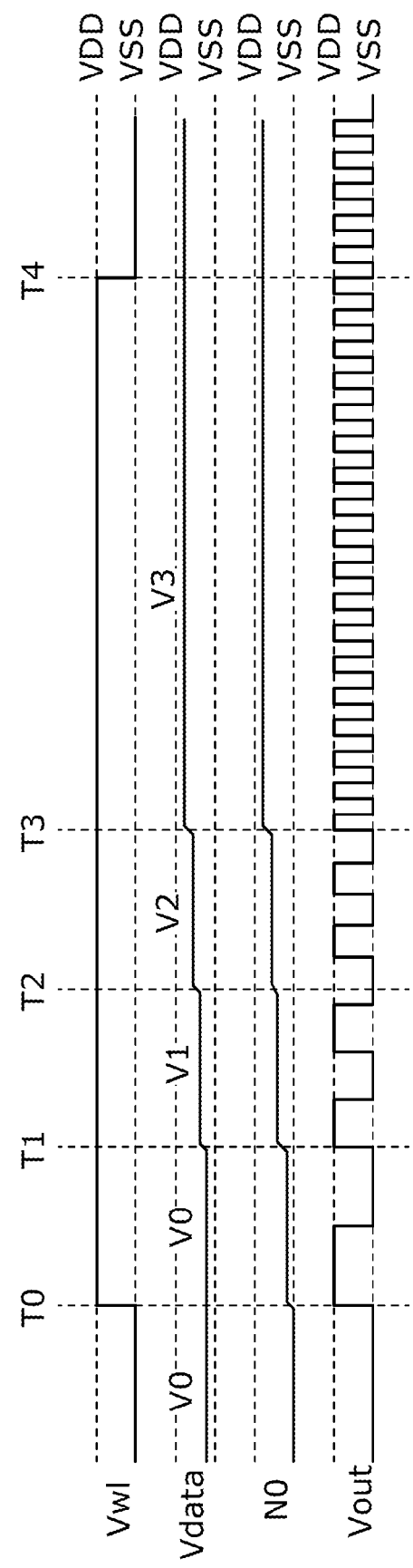
FIG. 8 is a timing chart illustrating operation of a voltage controlled oscillator.

FIG. 8 is a timing chart of the voltage controlled oscillator VCO that includes ($2n$+1) first circuit components 10 in FIG. 3. Note that in FIG. 8, the gate of the transistor 15 in the third circuit component 12 that is included in one first circuit component 10 is referred to as a node N0.

As illustrated in FIG. 8, in an initial state before time T0, the transistor 16 is off because the signal Vw1 is at a low level. Thus, the potential V0 of the signal Vdata is not supplied to the node N0. Since the potential of the node N0 is at a low level, the voltage controlled oscillator VCO does not oscillate, and the potential of the output signal Vout maintains a low level.

Next, as illustrated in FIG. 8, at the time T0, when the potential of the signal Vw1 is set at a high level, the transistor 16 is turned on. Thus, the potential V0 of the signal Vdata is supplied to the node N0 through the transistor 16. Note that actually, the potential of the gate of the transistor 15 is decreased from the potential V0 by the threshold voltage of the transistor 16; however, FIG. 8 illustrates a timing chart on the assumption that the threshold voltage of the transistor 16 is 0 V.

By supply of the potential V0 to the gate of the transistor 15, the source-drain resistance of the transistor 15 becomes slightly lower than that in the initial state before the time T0. Thus, signals can be transmitted between the first circuit components 10. Accordingly, the voltage controlled oscillator VCO starts to oscillate, the frequency of a potential change between a high level and a low level of the output signal Vout, namely, oscillation frequency becomes higher than 0 Hz.

Next, at time T1, the potential of the signal Vw1 maintains a high level; thus, the transistor 16 is kept in an on state. Then, the signal Vdata is increased from the potential V0 to a potential V1, and the potential V1 is supplied to the node N0 through the transistor 16.

By supply of the potential V1 that is higher than the potential V0 to the gate of the transistor 15, the source-drain resistance of the transistor 15 becomes slightly lower than that in the times T0 to T1. Thus, the voltage controlled oscillator VCO oscillates so that the oscillation frequency of the output signal Vout becomes higher than that in the times T0 to T1.

Next, at time T2, the potential of the signal Vw1 maintains a high level; thus, the transistor 16 is kept in an on state. Then, the signal Vdata is increased from the potential V1 to a potential V2, and the potential V2 is supplied to the node N0 through the transistor 16.

By supply of the potential V2 that is higher than the potential V1 to the gate of the transistor 15, the source-drain resistance of the transistor 15 becomes slightly lower than that in the times T1 to T2. Thus, the voltage controlled oscillator VCO oscillates so that the oscillation frequency of the output signal Vout becomes higher than that in the times T1 to T2.

Next, at time T3, the potential of the signal Vw1 maintains a high level; thus, the transistor 16 is kept in an on state. Then, the signal Vdata is increased from the potential V2 to a potential V3, and the potential V3 is supplied to the node N0 through the transistor 16.

By supply of the potential V3 that is higher than the potential V2 to the gate of the transistor 15, the source-drain resistance of the transistor 15 becomes slightly lower than that in the times T2 to T3. Thus, the voltage controlled oscillator VCO oscillates so that the oscillation frequency of the output signal Vout becomes higher than that in the times T2 to T3.

Next, at time T4, the potential of the signal Vw1 is set at a low level; thus, the transistor 16 is turned off. In the case where the off-state current of the transistor 16 is extremely low, the potential of the node N0 is held. Accordingly, the source-drain resistance of the transistor 15 is also held, and the voltage controlled oscillator VCO oscillates to maintain the oscillation frequency of the output signal Vout.

FIG. 1 illustrates the structure of the voltage controlled oscillator VCO in which a plurality of first circuit components 10 each include the third circuit component 12. Note that in the voltage controlled oscillator VCO according to one embodiment of the present invention, a plurality of first circuit components 10 may share the third circuit component 12.

<Second Structure Example of Voltage Controlled Oscillator>

Figure 4:
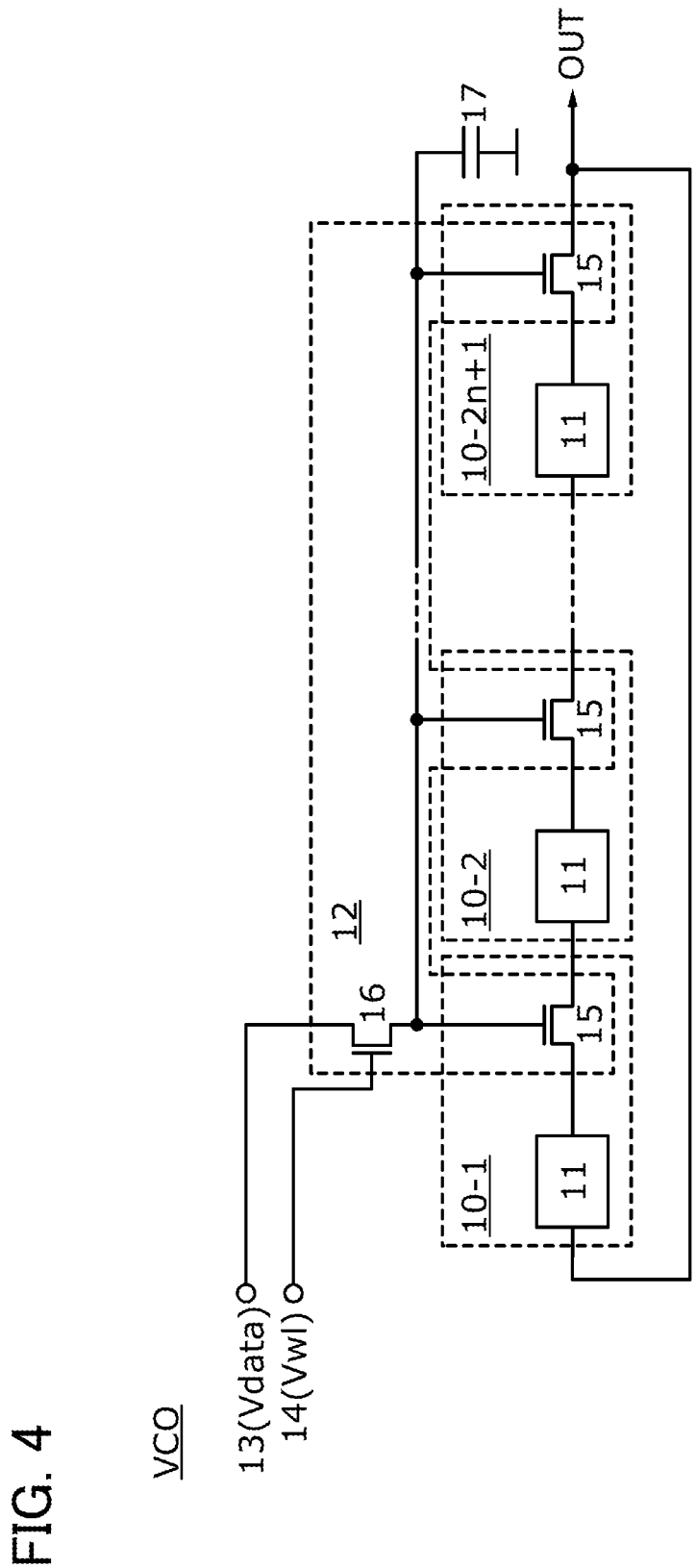
FIG. 4 is a circuit diagram illustrating a structure example of a voltage controlled oscillator.

Next, FIG. 4 illustrates a structure example of the voltage controlled oscillator VCO in which a plurality of first circuit components 10 share the third circuit component 12. The voltage controlled oscillator VCO in FIG. 4 includes the $(2n+1)$ first circuit components 10-1 to 10-$2n$+1. Each of the $(2n+1)$ first circuit components 10 includes the second circuit component 11. The $(2n+1)$ first circuit components 10 share the third circuit component 12.

In FIG. 4, the third circuit component 12 includes $(2n+1)$ transistors 15 corresponding to the $(2n+1)$ first circuit components 10, and the voltage controlled oscillator VCO includes one transistor 16 and one capacitor 17. Specifically, a gate of the one transistor 16 is electrically connected to the wiring 14. One of a source and a drain of the one transistor 16 is electrically connected to the wiring 13, and the other of the source and the drain of the one transistor 16 is electrically connected to each of gates of the $(2n+1)$ transistors 15. One electrode of the one capacitor 17 is electrically connected to each of the gates of the $(2n+1)$ transistors 15, and the other electrode of the one capacitor 17 is electrically connected to a wiring (not illustrated) to which a predetermined potential is supplied.

In the voltage controlled oscillator VCO in FIG. 4, when the potential of the signal Vw1 supplied to the wiring 14 is at a high level, the transistor 16 is turned on, and the potential of the signal Vdata input to the wiring 13 is supplied to each of the gates of the $(2n+1)$ transistors 15 through the transistor 16. The source-drain resistance of each of the $(2n+1)$ transistors 15 is controlled in accordance with a potential supplied to each of the gates of the $(2n+1)$ transistors 15. Thus, in the third circuit component 12, the signal delay time between the input terminal 18 and the output terminal 19 is controlled in accordance with the potential of the signal Vdata.

Note that also in the voltage controlled oscillator VCO in FIG. 4 and the voltage controlled oscillator VCO in which the structure in FIG. 1 is combined with the structures of the third circuit component 12 in FIGS. 2A and 2B, to prevent the potential of the gate of the transistor 15 from being changed by capacitive coupling through parasitic capacitance such as the gate capacitance of the transistor 15 and the gate capacitance of the transistor 16, the capacitance of the capacitor 17 is preferably higher than the gate capacitance of the transistor 15 and the gate capacitance of the transistor 16. Such a structure can prevent the potential of the gate of the transistor 15 and the oscillation frequency of the signal Vout from being changed.

In the case of the voltage controlled oscillator VCO in FIG. 4, gates of a plurality of transistors 15 are electrically connected to each other. The potential of the output terminal of the second circuit component 11 is changed in an opposite direction between the first circuit component 10 in an even-numbered stage and the first circuit component 10 in an odd-numbered stage; thus, a change in the potential of the gate of the transistor 15 that is caused by capacitive coupling through the gate capacitance of the transistor 15 is likely to be canceled. Accordingly, as compared to the voltage controlled oscillator VCO in which the structure in FIG. 1 is combined with the structures of the third circuit component 12 in FIGS. 2A and 2B, in the voltage controlled oscillator VCO in FIG. 4, the potential of the gate of the transistor 15 is unlikely to be changed and a change in the oscillation frequency of the signal Vout is small.

<Third Structure Example of Voltage Controlled Oscillator>

Figure 5:
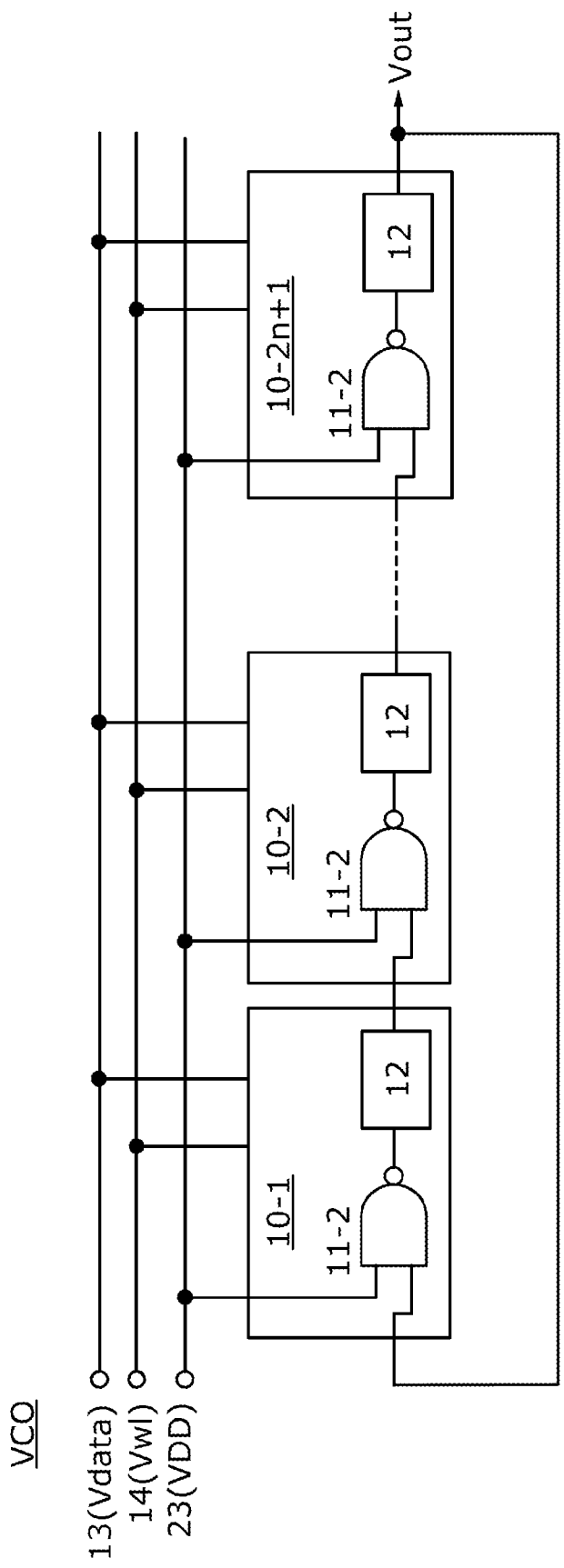
FIG. 5 is a circuit diagram illustrating a structure example of a voltage controlled oscillator.

Next, FIG. 5 illustrates a structure example of the voltage controlled oscillator VCO that includes a NAND 11-2 as the second circuit component 11.

The voltage controlled oscillator VCO in FIG. 5 includes the $(2n+1)$ first circuit components 10-1 to 10-$2n$+1. Each of the $(2n+1)$ first circuit components 10 includes the NAND 11-2 functioning as the second circuit component 11 and the third circuit component 12.

In the first circuit component 10 in FIG. 5, a high-level potential VDD is supplied to one of two input terminals of the NAND 11-2 through a wiring 23. An output terminal of the NAND 11-2 is electrically connected to the input terminal of the third circuit component 12. In each of the first circuit components 10 in stages other than the first stage, the output terminal of the first circuit component 10 in the previous stage is electrically connected to the other of the two input terminals of the NAND 11-2. In addition, in the first circuit component 10-1 in the first stage, the output terminal of the first circuit component 10-$2n$+1 in the final stage is electrically connected to the other of the two input terminals of the NAND 11-2.

Note that in FIG. 5, the high-level potential VDD is supplied to one of the two input terminals of the NAND 11-2 through the wiring 23; however, the high-level potential VDD may be supplied to the other of the two input terminals of the NAND 11-2 through the wiring 23. In that case, in each of the first circuit components 10 in the stages other than the first stage, the output terminal of the first circuit component 10 in the previous stage is electrically connected to one of the two input terminals of the NAND 11-2. In addition, in the first circuit component 10-1 in the first stage, the output terminal of the first circuit component 10-$2n$+1 in the final stage is electrically connected to one of the two input terminals of the NAND 11-2.

<Fourth Structure Example of Voltage Controlled Oscillator>

Figure 6:
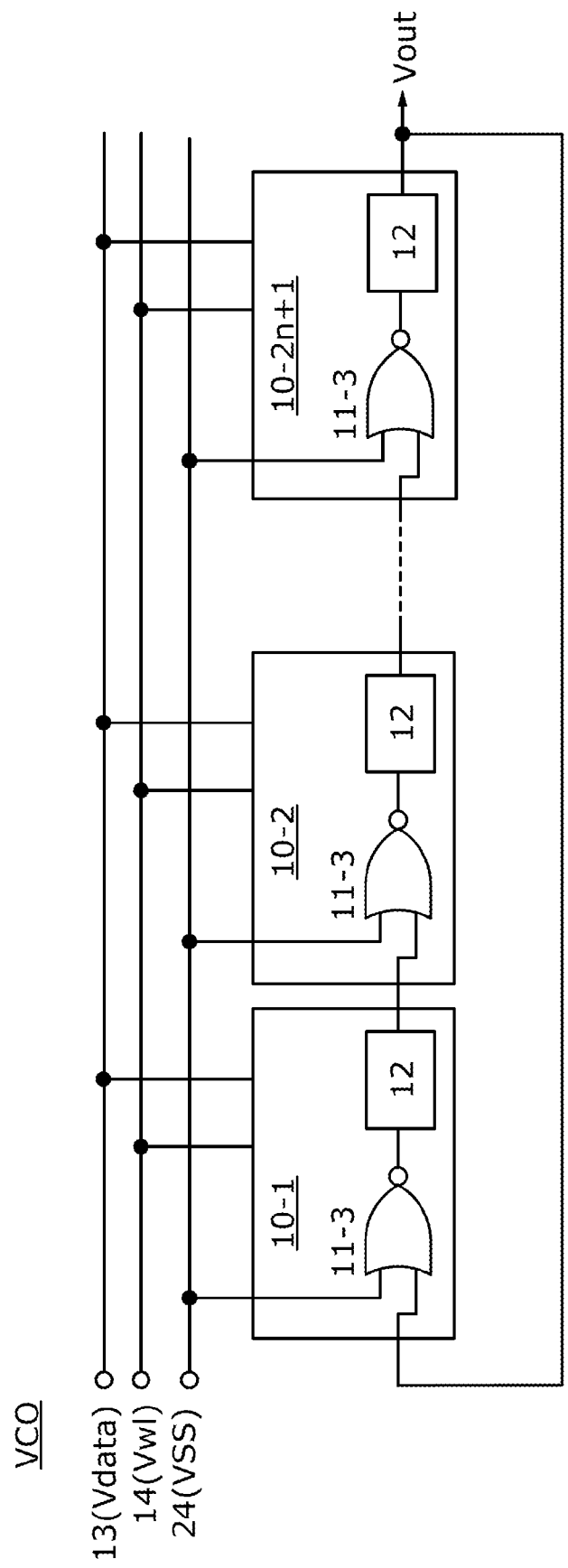
FIG. 6 is a circuit diagram illustrating a structure example of a voltage controlled oscillator.

Next, FIG. 6 illustrates a structure example of the voltage controlled oscillator VCO that includes a NOR 11-3 as the second circuit component 11.

The voltage controlled oscillator VCO in FIG. 6 includes the $(2n+1)$ first circuit components 10-1 to 10-$2n$+1. Each of the $(2n+1)$ first circuit components 10 includes the NOR 11-3 functioning as the second circuit component 11 and the third circuit component 12.

In the first circuit component 10 in FIG. 6, a low-level potential VSS is supplied to one of two input terminals of the NOR 11-3 through a wiring 24. An output terminal of the NOR 11-3 is electrically connected to the input terminal of the third circuit component 12. In each of the first circuit components 10 in the stages other than the first stage, the output terminal of the first circuit component 10 in the previous stage is electrically connected to the other of the two input terminals of the NOR 11-3. In addition, in the first circuit component 10-1 in the first stage, the output terminal of the first circuit component 10-$2n$+1 in the final stage is electrically connected to the other of the two input terminals of the NOR 11-3.

Note that in FIG. 6, the low-level potential VSS is supplied to one of the two input terminals of the NOR 11-3 through the wiring 24; however, the low-level potential VSS may be supplied to the other of the two input terminals of the NOR 11-3 through the wiring 24. In that case, in each of the first circuit components 10 in the stages other than the first stage, the output terminal of the first circuit component 10 in the previous stage is electrically connected to one of the two input terminals of the NOR 11-3. In addition, in the first circuit component 10-1 in the first stage, the output terminal of the first circuit component 10-2n+1 in the final stage is electrically connected to one of the two input terminals of the NOR 11-3.

<Structure Example of Phase Synchronous Circuit>

Figure 7:
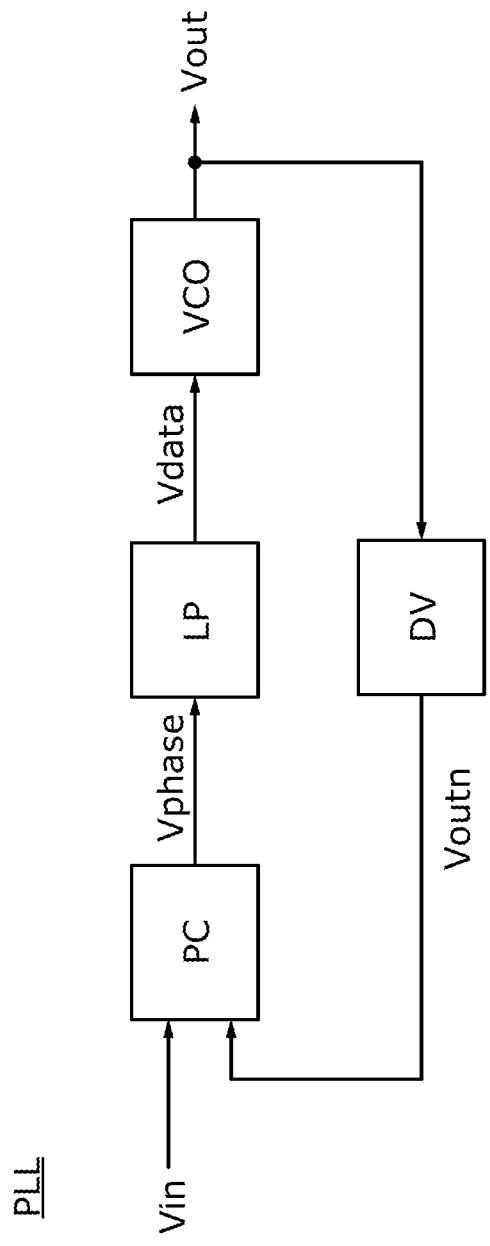
FIG. 7 is a block diagram illustrating a structure example of a phase synchronous circuit.

Next, FIG. 7 illustrates a structure example of a phase synchronous circuit PLL (phase locked loop) that corresponds to an example of a semiconductor device including the voltage controlled oscillator VCO according to one embodiment of the present invention.

The phase synchronous circuit PLL in FIG. 7 includes a phase comparator PC, a loop filter LP, the voltage controlled oscillator VCO according to one embodiment of the present invention, and a frequency divider DV. The phase comparator PC has a function of generating a signal Vphase based on a phase difference between an input signal Vin of the phase synchronous circuit PLL and a signal Voutn generated in the frequency divider DV. The loop filter LP has functions of removing a high-frequency component contained in an output signal of the phase comparator PC and generating the signal Vdata. That is, the loop filter LP functions as a low pass filter. The frequency divider DV has a function of generating the signal Voutn that corresponds to the specified fraction of the integer of the frequency of the output signal Vout of the voltage controlled oscillator VCO from the output signal Vout.

<Structure Example of Semiconductor Device>

Next, a structure example of a semiconductor device 30 according to one embodiment of the present invention is described.

Figure 9:
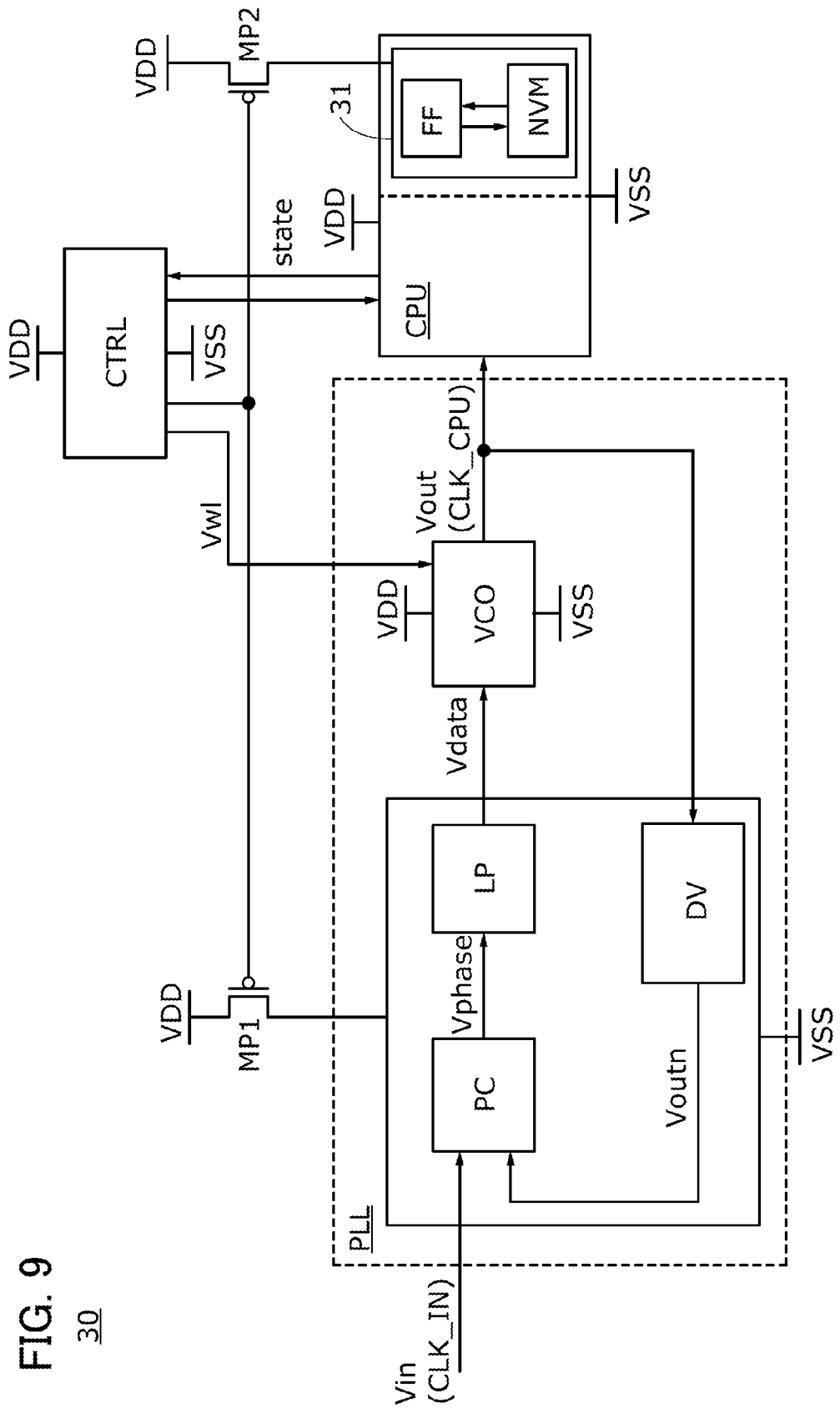
FIG. 9 is a block diagram illustrating a structure example of a semiconductor device.

FIG. 9 is a block diagram illustrating the structure of the semiconductor device 30. Although the block diagram illustrates elements classified according to their functions in independent blocks, it may be practically difficult to completely separate the elements according to their functions and, in some cases, one element may be involved in a plurality of functions.

The semiconductor device 30 in FIG. 9 includes the phase comparator PC, the loop filter LP, the voltage controlled oscillator VCO according to one embodiment of the present invention, and the frequency divider DV. The phase comparator PC, the loop filter LP, the voltage controlled oscillator VCO, and the frequency divider DV are included in the phase synchronous circuit PLL illustrated in FIG. 7. The semiconductor device 30 in FIG. 9 further includes a central processing unit CPU, a controller CTRL, a power switch MP1, and a power switch MP2.

A wiring to which a clock signal CLK_IN corresponding to the input signal Vin is supplied is electrically connected to a first input terminal of the phase comparator PC. An output terminal of the frequency divider DV is electrically connected to a second input terminal of the phase comparator PC. An output terminal of the phase comparator PC is electrically connected to an input terminal of the loop filter LP.

An output terminal of the loop filter LP is electrically connected to an input terminal of the voltage controlled oscillator VCO. An output terminal of the voltage controlled oscillator VCO is electrically connected to an input terminal of the frequency divider DV. The output signal Vout from the voltage controlled oscillator VCO is supplied to the central processing unit CPU as a clock signal CLK_CPU.

The high-level potential VDD and the low-level potential VSS are supplied to the voltage controlled oscillator VCO.

The low-level potential VSS is supplied to the phase comparator PC, the loop filter LP, and the frequency divider DV, and the high-level potential VDD is supplied to the phase comparator PC, the loop filter LP, and the frequency divider DV through the power switch MP1. In FIG. 9, a p-channel transistor is used as the power switch MP1. The on or off state of the power switch MP1 is selected in accordance with a signal supplied from the controller CTRL to a gate of the power switch MP1. One of a source and a drain of the power switch MP1 is electrically connected to a wiring to which the potential VDD is supplied. The other of the source and the drain of the power switch MP1 is electrically connected to power source terminals of the phase comparator PC, the loop filter LP, and the frequency divider DV.

The low-level potential VSS is supplied to the central processing unit CPU, and the high-level potential VDD is supplied to the central processing unit CPU through the power switch MP2. In FIG. 9, a p-channel transistor is used as the power switch MP2. The on or off state of the power switch MP2 is selected in accordance with a signal supplied from the controller CTRL to a gate of the power switch MP2. One of a source and a drain of the power switch MP2 is electrically connected to a wiring to which the potential VDD is supplied. The other of the source and the drain of the power switch MP2 is electrically connected to a power domain 31 included in the central processing unit CPU.

In FIG. 9, a volatile flip-flop FF functioning as a buffer storage device and a nonvolatile memory NVM are included in the power domain 31. In the central processing unit CPU, the potential VDD is supplied without the power switch MP2 in regions other than the power domain 31 to which the potential VDD is supplied through the power switch MP2.

Note that the power switch MP1 or the power switch MP2 may be an n-channel transistor according to circumstances.

The central processing unit CPU has a function of executing arithmetic processing based on a program. The central processing unit CPU may have a structure in which data of the flip-flop FF is backed up and retained in the memory NVM or a structure in which data of the memory NVM is recovered to the flip-flop FF. When the central processing unit CPU has the above structure, the central processing unit CPU can have a normally-off function in which even if the power switch MP2 is turned off during arithmetic processing and supply of power to the power domain 31 is stopped, the central processing unit CPU can restart its operation from the arithmetic processing at the time of backup in restarting the supply of power without losing data during the arithmetic processing.

In the phase synchronous circuit PLL, even when the power switch MP1 is turned off and the supply of power to the phase comparator PC, the loop filter LP, and the frequency divider DV is stopped, the oscillation frequency of the clock signal CLK_CPU output from the voltage controlled oscillator VCO maintains a set value. Thus, the use of the voltage controlled oscillator VCO according to one embodiment of the present invention can reduce the power consumption of the phase synchronous circuit PLL, furthermore, the power consumption of the semiconductor device 30.

Note that when a frequency divider, a prescaler, or the like is added to the phase synchronous circuit PLL, the oscillation frequency of the clock signal CLK_CPU can be set precisely.

The high-level potential VDD and the low-level potential VSS are supplied to the controller CTRL. The controller CTRL has a function of controlling switching of conduction and non-conduction states of the power switch MP1 and the power switch MP2 and a function of controlling the supply of the signal Vdata to the voltage controlled oscillator VCO. Note that the above control is performed in accordance with an instruction from the central processing unit CPU.

Specifically, in the case where the operating state of the central processing unit CPU is transferred to a normally-off state in which the supply of power to the power domain 31 is stopped, the potential of a signal state transmitted to the controller CTRL is changed into a potential that corresponds to a logical value indicating the normally-off state (e.g., a high-level potential). The controller CTRL turns off the power switch MP1 and the power switch MP2 in accordance with a change in the potential of the signal state. Furthermore, the gate of the transistor 15 included in the third circuit component 12 is made floating by setting the potential of the signal Vw1 supplied from the controller CTRL to the voltage controlled oscillator VCO at a low level. Through the above operation, even when the supply of the signal Vdata from the loop filter LP is stopped, the oscillation frequency of the clock signal CLK_CPU output from the voltage controlled oscillator VCO can maintain a set value.

In the case where the operating state of the central processing unit CPU is transferred from the normally-off state to a normal operation state, the potential of the signal state transmitted to the controller CTRL is changed into a potential that corresponds to a logical value indicating transfer from the normally-off state (e.g., a low-level potential). The controller CTRL turns on the power switch MP1 and the power switch MP2 in accordance with a change in the potential of the signal state. Furthermore, the signal Vdata is supplied to the gate of the transistor 15 included in the third circuit component 12 by setting the potential of the signal Vw1 supplied from the controller CTRL to the voltage controlled oscillator VCO at a high level. Through the above operation, even when the supply of the signal Vdata from the loop filter LP is restarted, the oscillation frequency of the clock signal CLK_CPU output from the voltage controlled oscillator VCO can be set in accordance with the signal Vdata.

<Example of Cross-Sectional Structure of Semiconductor Device>

Figure 10:
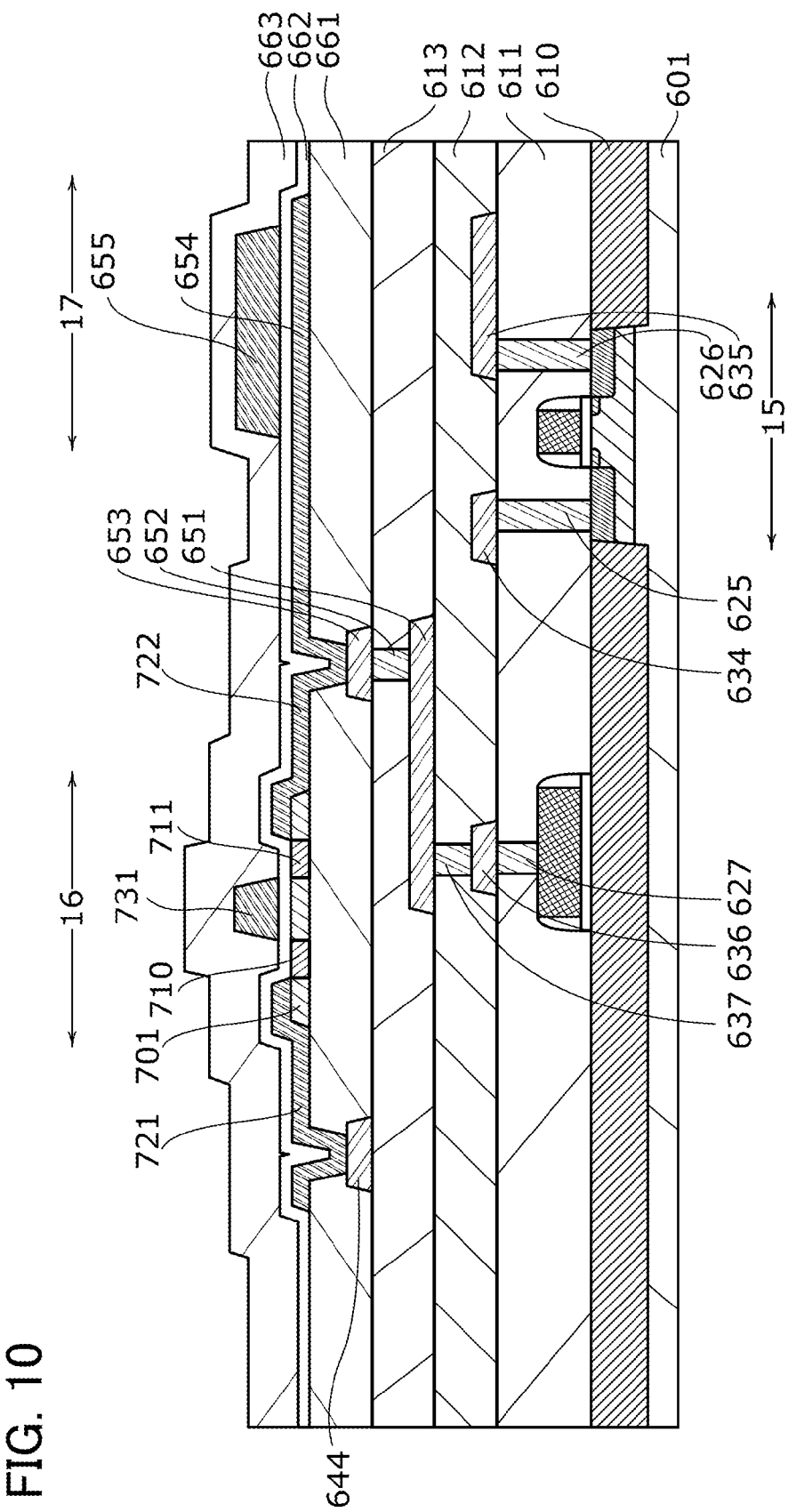
FIG. 10 is a cross-sectional view illustrating the cross-sectional structure of a semiconductor device.

FIG. 10 illustrates an example of a cross-sectional structure of a semiconductor device according to one embodiment of the present invention. Note that FIG. 10 is an example of a cross-sectional view of the transistor 16, the capacitor 17, and the transistor 15 in FIG. 2A. In FIG. 10, the capacitor 17 and the transistor 16 including a channel formation region in an oxide semiconductor film are formed over the transistor 15 including a channel formation region in a single crystal silicon substrate.

The transistor 15 may include a channel formation region in a semiconductor film or a semiconductor substrate of silicon, germanium, or the like in an amorphous, microcrystalline, polycrystalline, or single crystal state. Alternatively, the transistor 15 may include a channel formation region in an oxide semiconductor film or an oxide semiconductor substrate. In the case where the transistors each include a channel formation region in an oxide semiconductor film or an oxide semiconductor substrate, the transistor 16 is not necessarily stacked over the transistor 15, and the transistors 15 and 16 may be formed in the same layer.

In the case where the transistor 15 is formed using a silicon thin film, any of the following can be used for the thin film: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 15 is formed can be, for example, a silicon substrate, a germanium substrate, or a silicon germanium substrate. In FIG. 10, a single crystal silicon substrate is used as the semiconductor substrate 601.

The transistor 15 is electrically isolated by element isolation. Selective oxidation (e.g., local oxidation of silicon (LOCOS)), trench isolation (e.g., shallow trench isolation (STI)), or the like can be used as the element isolation. In FIG. 10, the transistor 15 is electrically isolated by trench isolation. Specifically, in FIG. 10, the transistor 15 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 15. Openings are formed in the insulating film 611. Conductive films 625 and 626 that are electrically connected to the source and the drain of the transistor 15 and a conductive film 627 that is electrically connected to the gate of the transistor 15 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 to 636. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive films 653 and 644. In FIG. 10, the transistor 16 and the capacitor 17 are formed over the insulating film 661.

The transistor 16 includes, over the insulating film 661, a semiconductor film 701 including an oxide semiconductor, conductive films 721 and 722 functioning as a source and a drain over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 16, there is a region 710 between a region overlapping with the conductive film 721 and a region overlapping with the gate electrode 731. In addition, in the semiconductor film 701 of the transistor 16, there is a region 711 between a region overlapping with the conductive film 722 and the region overlapping with the gate electrode 731. When argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

Furthermore, the capacitor 17 includes a conductive film 654 over the insulating film 661, the gate insulating film 662 overlapping with the conductive film 654, and a conductive film 655 overlapping with the conductive film 654 with the gate insulating film 662 positioned therebetween. The conductive film 654 can be formed together with the conductive film 722 by forming a conductive film over the insulating film 661 and processing the conductive film into a desired shape. The conductive film 655 can be formed together with the gate electrode 731 by forming a conductive film over the gate insulating film 662 and processing the conductive film into a desired shape.

An insulating film 663 is provided over the transistor 16 and the capacitor 17.

Note that in FIG. 10, the transistor 16 includes the gate electrode 731 on at least one side of the semiconductor film 701. Alternatively, the transistor 16 may include a pair of gate electrodes with the semiconductor film 701 positioned therebetween.

When the transistor 16 includes a pair of gate electrodes with the semiconductor film 701 positioned therebetween, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 10, the transistor 16 has a single-gate structure where one channel formation region corresponding to one gate electrode 731 is provided. However, the transistor 16 may have a multi-gate structure where a plurality of channel formation regions are formed in one active layer by providing a plurality of gate electrodes electrically connected to each other.

<Transistor>

Next, a structure example of a transistor 90 that includes a channel formation region in an oxide semiconductor film is described.

Figure 11A:
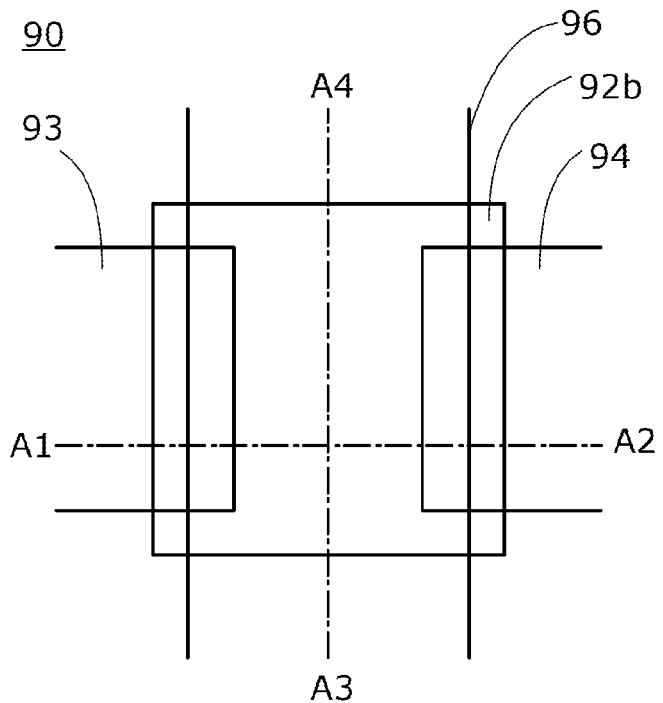
FIGS. 11A to 11C are a top view and cross-sectional views illustrating a structure example of a transistor.
Figure 11C:
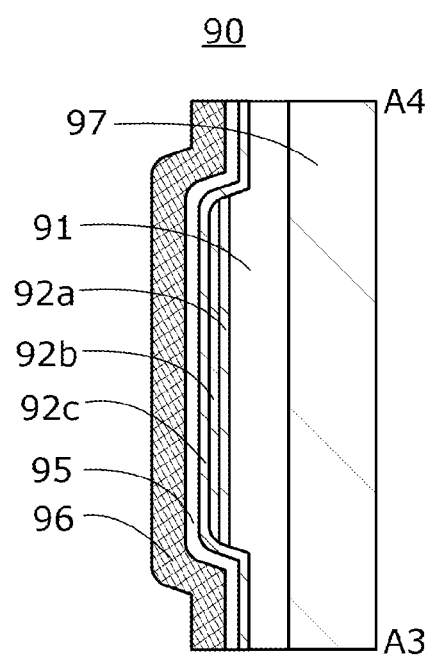
Figure 11B:
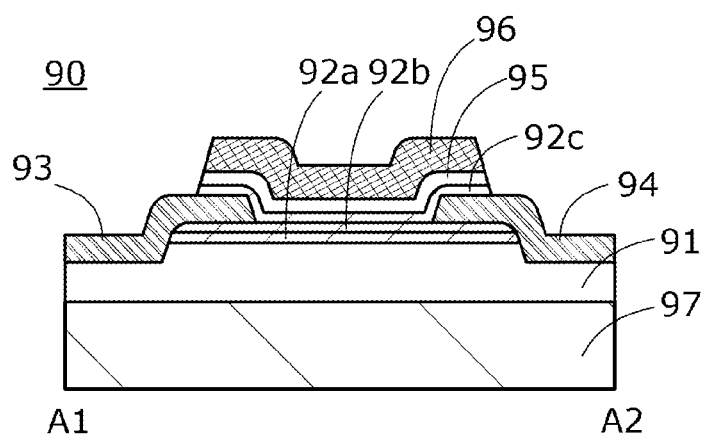

FIGS. 11A to 11C illustrate a structure example of the transistor 90 that includes a channel formation region in an oxide semiconductor film. FIG. 11A is a top view of the transistor 90. Note that insulating films are not illustrated in FIG. 11A to clarify the layout of the transistor 90. FIG. 11B is a cross-sectional view taken along dashed line A1-A2 in the top view of FIG. 11A. FIG. 11C is a cross-sectional view taken along dashed line A3-A4 in the top view of FIG. 11A.

As illustrated in FIGS. 11A to 11C, the transistor 90 includes a substrate 97, an insulating film 91, an oxide semiconductor film 92a, an oxide semiconductor film 92b, an oxide semiconductor film 92c, a conductive film 93, a conductive film 94, an insulating film 95, and a conductive film 96. The insulating film 91 is formed over the substrate 97. The oxide semiconductor film 92a is provided over the insulating film 91. The oxide semiconductor film 92b is provided over the oxide semiconductor film 92a. The conductive film 93 functioning as one of a source electrode and a drain electrode and the conductive film 94 functioning as the other of the source electrode and the drain electrode are provided over the oxide semiconductor film 92b and the insulating film 91. The oxide semiconductor film 92c is provided over the conductive film 93, the conductive film 94, and the oxide semiconductor film 92b. The insulating film 95 functioning as a gate insulating film is provided over the oxide semiconductor film 92c. The conductive film 96 functioning as a gate electrode is provided over the insulating film 95 to overlap with the oxide semiconductor films 92a to 92c. Note that the substrate 97 may be a glass substrate, a semiconductor substrate, or the like, or may be an element substrate where semiconductor elements are formed over a glass substrate or on a semiconductor substrate.

Figure 12A:
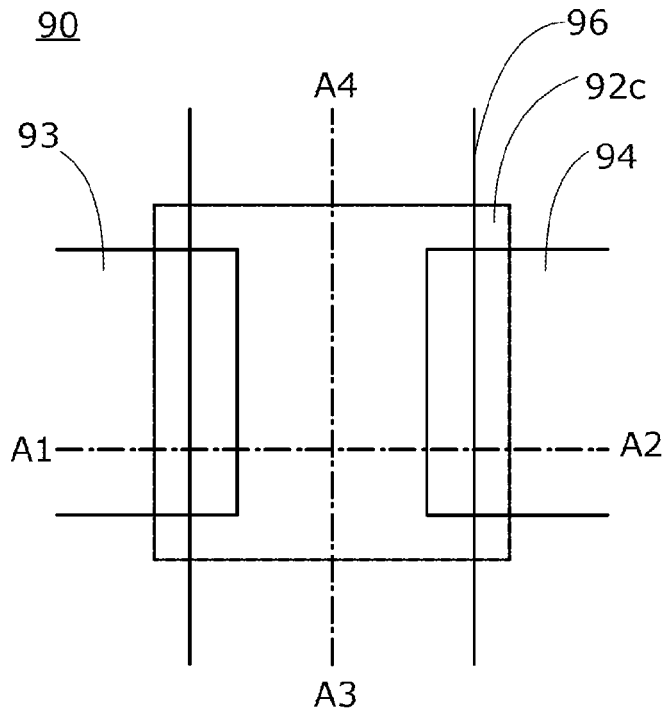
FIGS. 12A to 12C are a top view and cross-sectional views illustrating a structure example of a transistor.
Figure 12C:
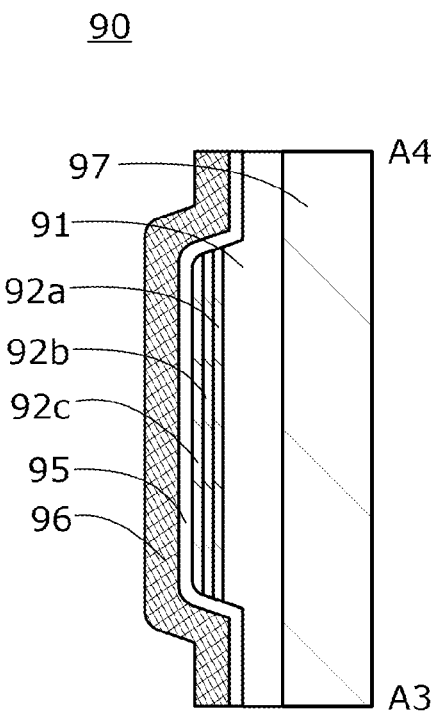
Figure 12B:
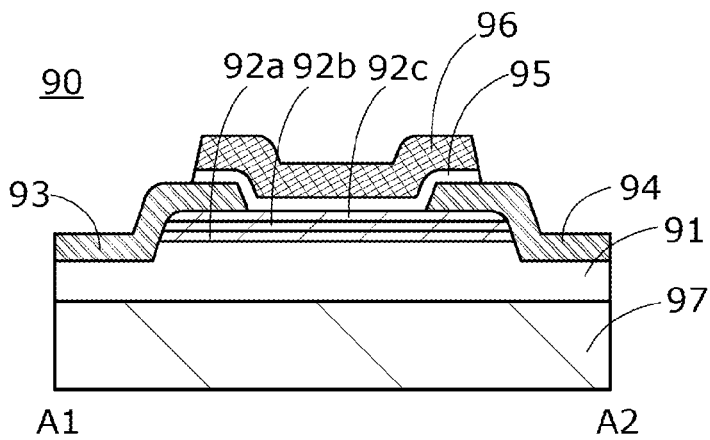

FIGS. 12A to 12C illustrate another specific structure example of the transistor 90. FIG. 12A is a top view of the transistor 90. Note that insulating films are not illustrated in FIG. 12A to clarify the layout of the transistor 90. FIG. 12B is a cross-sectional view taken along dashed line A1-A2 in the top view of FIG. 12A. FIG. 12C is a cross-sectional view taken along dashed line A3-A4 in the top view of FIG. 12A.

As illustrated in FIGS. 12A to 12C, the transistor 90 includes the substrate 97, the insulating film 91, the oxide semiconductor film 92a, the oxide semiconductor film 92b, the oxide semiconductor film 92c, the conductive film 93, the conductive film 94, the insulating film 95, and the conductive film 96. The insulating film 91 is formed over the substrate 97. The oxide semiconductor film 92a is provided over the insulating film 91. The oxide semiconductor film 92b is provided over the oxide semiconductor film 92a. The oxide semiconductor film 92c is provided over the oxide semiconductor film 92b. The conductive film 93 functioning as one of the source electrode and the drain electrode and the conductive film 94 functioning as the other of the source electrode and the drain electrode are provided over the oxide semiconductor film 92c and the insulating film 91. The insulating film 95 functioning as a gate insulating film is provided over the oxide semiconductor film 92c. The conductive film 96 functioning as a gate electrode is provided over the insulating film 95 to overlap with the oxide semiconductor films 92a to 92c.

FIGS. 11A to 11C and FIGS. 12A to 12C each illustrate the structure of the transistor 90 in which the oxide semiconductor films 92a to 92c are stacked. The oxide semiconductor film of the transistor 90 is not limited to a stack of a plurality of oxide semiconductor films, but may be a single oxide semiconductor film.

In the case where the transistor 90 includes a semiconductor film in which the oxide semiconductor films 92a to 92c are stacked sequentially, each of the oxide semiconductor films 92a and 92c is an oxide film that contains at least one of metal elements contained in the oxide semiconductor film 92b and in which energy at the bottom of the conduction band is closer to the vacuum level than that in the oxide semiconductor film 92b by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 has the above semiconductor film, when an electric field is applied to the semiconductor film by application of voltage to a gate electrode, a channel region is formed in the s oxide semiconductor film 92b whose energy at the bottom of the conduction band is low in the semiconductor film. In other words, the oxide semiconductor film 92c is provided between the oxide semiconductor film 92b and the insulating film 95, so that a channel region can be formed in the oxide semiconductor film 92b spaced from the insulating film 95.

Since the oxide semiconductor film 92c contains at least one of the metal elements contained in the oxide semiconductor film 92b, interface scattering hardly occurs at an interface between the oxide semiconductor film 92b and the oxide semiconductor film 92c. Thus, carriers are not easily inhibited from moving at the interface, which results in an increase in field-effect mobility of the transistor 90.

When an interface state is formed at an interface between the oxide semiconductor films 92a and 92b, a channel region is also formed in a region close to the interface; thus, the threshold voltage of the transistor 90 varies. However, since the oxide semiconductor film 92a contains at least one of the metal elements contained in the oxide semiconductor film 92b, an interface state is hardly formed at the interface between the oxide semiconductor films 92a and 92b. As a result, such a structure can reduce variations in electrical characteristics (e.g., threshold voltage) of the transistor 90.

The plurality of oxide semiconductor films are preferably stacked so that impurities between the oxide semiconductor films do not form an interface state that inhibits carriers from moving at an interface of each film. If impurities exist between the plurality of stacked oxide semiconductor films, the continuity of energy at the bottom of the conduction band between the oxide semiconductor films is lost, and carriers are trapped or lost due to recombination around the interface. A continuous bond (especially, a bond having a U-shaped and well-shaped structure where energy at the bottom of the conduction band is continuously changed between the films) is more likely to be formed in the plurality of oxide semiconductor films containing at least one metal element (main component) in which impurities between the films are reduced than in the plurality of oxide semiconductor films that contain at least one metal element (main component) and are simply stacked.

In order to form such a continuous bond, it is necessary to form films continuously without being exposed to the atmosphere with the use of a multi-chamber deposition apparatus (sputtering apparatus) including a load lock chamber. Each chamber of the sputtering apparatus is preferably evacuated to a high vacuum (to approximately $5 \times 10^{-7}$ to $1 \times 10^{-4}$ Pa) by an adsorption vacuum pump such as a cryopump so that water and the like, which are impurities for an oxide semiconductor, are removed as much as possible. Alternatively, a turbo molecular pump and a cold trap are preferably used in combination to prevent backflow of gas into the chamber through an evacuation system.

To obtain a highly-purified intrinsic oxide semiconductor, not only high vacuum evacuation of the chambers but also high purification of a sputtering gas is important. An oxygen gas or an argon gas used as the gas is highly purified to have a dew point of −40° C. or lower, preferably −80° C. or lower, more preferably −100° C. or lower, so that entry of moisture or the like into the oxide semiconductor film can be prevented as much as possible. Specifically, when the oxide semiconductor film 92b is an In-M-Zn oxide film (M is Ga, Y, Zr, La, Ce, or Nd) and a target with an atomic ratio of metal elements of In:M:Zn=$x_1$:$y_1$:$z_1$ is used to form the oxide semiconductor film 92b, $x_1/y_1$ is preferably ⅓ to 6, more preferably 1 to 6, and $z_1/y_1$ is preferably ⅓ to 6, more preferably 1 to 6. Note that when $z_1/y_1$ is 1 to 6, a CAAC-OS film is likely to be formed as the oxide semiconductor film 92b. Typical examples of the atomic ratio of the metal elements of the target are In:M:Zn=1:1:1 and In:M:Zn=3:1:2.

Specifically, when the oxide semiconductor films 92a and 92c are each an In-M-Zn oxide film and a target with an atomic ratio of metal elements of In:M:Zn=$x_2$:$y_2$:$z_2$ is used to form the oxide semiconductor films 92a and 92c, $x_2/y_2 < x_1/y_1$ is satisfied and $z_2 y_2$ is preferably ⅓ to 6, more preferably 1 to 6. Note that when $z_2/y_2$ is 1 to 6, CAAC-OS films are likely to be formed as the oxide semiconductor films 92a and 92c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor films 92a and 92c each have a thickness of 3 to 100 nm, preferably 3 to 50 nm. The oxide semiconductor film 92b has a thickness of 3 to 200 nm, preferably 3 to 100 nm, and more preferably 3 to 50 nm.

In a three-layer semiconductor film, the oxide semiconductor films 92a to 92c can be either amorphous or crystalline. Note that the oxide semiconductor film 92b in which a channel region is formed is preferably crystalline because the transistor 90 can have stable electrical characteristics.

Note that a channel formation region means a region of a semiconductor film of a transistor that overlaps with a gate electrode and is between a source electrode and a drain electrode. Furthermore, a channel region means a region through which current mainly flows in the channel formation region.

For example, in the case where an In—Ga—Zn oxide film formed by sputtering is used as each of the oxide semiconductor films 92a and 92c, a target of an In—Ga—Zn oxide (In:Ga:Zn=1:3:2 [atomic ratio]) can be used for deposition of the oxide semiconductor films 92a and 92c. The deposition conditions can be, for example, as follows: an argon gas (flow rate: 30 sccm) and an oxygen gas (flow rate: 15 sccm) are used as a deposition gas; pressure is 0.4 Pa; substrate temperature is 200° C.; and DC power is 0.5 kW.

In the case where the oxide semiconductor film 92b is a CAAC-OS film, the oxide semiconductor film 92b is preferably deposited using a polycrystalline target containing an In—Ga—Zn oxide (In:Ga:Zn=1:1:1 [atomic ratio]). The deposition conditions can be, for example, as follows: an argon gas (flow rate: 30 sccm) and an oxygen gas (flow rate: 15 sccm) are used as a deposition gas; pressure is 0.4 Pa; substrate temperature is 300° C.; and DC power is 0.5 kW.

Although the oxide semiconductor films 92a to 92c can be formed by sputtering, they may be formed by another method, for example, thermal CVD. Metal organic chemical vapor deposition (MOCVD) or atomic layer deposition (ALD) may be employed as an example of thermal CVD.

There are few carrier generation sources in a highly purified oxide semiconductor (purified oxide semiconductor) obtained by reduction of impurities such as moisture and hydrogen serving as electron donors (donors) and reduction of oxygen vacancies; thus, the highly purified oxide semiconductor can be an intrinsic (i-type) semiconductor or a substantially intrinsic semiconductor. For this reason, a transistor including a channel formation region in a highly purified oxide semiconductor film has extremely low off-state current and high reliability. A transistor including the oxide semiconductor film in which a channel formation region is formed is likely to have positive threshold voltage (normally-off characteristics).

Specifically, various experiments can prove low off-state current of a transistor including a channel formation region in a highly-purified oxide semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which charge flowing into or from the capacitor is controlled by the transistor. In the measurement, a highly-purified oxide semiconductor film was used in the channel formation region of the transistor, and the off-state current of the transistor was measured from a change in the amount of charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by sputtering or a wet process. Furthermore, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide (also referred to as IGZO), an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide can be used as an oxide semiconductor.

Note that, for example, an In—Ga—Zn oxide means an oxide containing In, Ga, and Zn, and there is no limitation on the ratio of In, Ga, and Zn. In addition, the In—Ga—Zn oxide may contain a metal element other than In, Ga, and Zn. The In—Ga—Zn oxide has sufficiently high resistance when no electric field is applied thereto, so that off-state current can be sufficiently reduced. Furthermore, the In—Ga—Zn oxide has high mobility.

For example, with an In—Sn—Zn oxide, high mobility can be comparatively easily obtained. However, even with an In—Ga—Zn oxide, mobility can be increased by lowering defect density in a bulk.

In the transistor 90, metal in the source electrode and the drain electrode extracts oxygen from the oxide semiconductor film depending on a conductive material used for the source electrode and the drain electrode. In that case, a region in the oxide semiconductor film that is in contact with the source electrode and the drain electrode has n-type conductivity due to generation of oxygen vacancies. Since the region having n-type conductivity functions as a source region or a drain region, contact resistance between the oxide semiconductor film and the source electrode and the drain electrode can be lowered. Thus, by forming the region having n-type conductivity, the mobility and on-state current of the transistor 90 can be increased, so that a semiconductor device including the transistor 90 can be operated at high speed.

Note that metal in the source electrode and the drain electrode might extract oxygen when the source electrode and the drain electrode are formed by sputtering or the like or might extract oxygen by heat treatment performed after the source electrode and the drain electrode are formed. Furthermore, the region having n-type conductivity is easily formed by using a conductive material that is easily bonded to oxygen for the source electrode and the drain electrode. The conductive material can be, for example, Al, Cr, Cu, Ta, Ti, Mo, or W.

Furthermore, in the case where the semiconductor film including the stacked oxide semiconductor films is used in the transistor 90, the regions having n-type conductivity preferably extend to the oxide semiconductor film 92b serving as a channel region in order that the mobility and on-state current of the transistor 90 can be increased and the semiconductor device can be operated at higher speed.

The insulating film 91 preferably has a function of supplying part of oxygen to the oxide semiconductor films 92a to 92c by heating. In addition, the insulating film 91 preferably has few defects, typically, spin density at g=2.001 due to a dangling bond of silicon is preferably lower than or equal to $1\times10^{18}$ spins/cm$^3$ when measured by ESR.

The insulating film 91 is preferably formed using an oxide to have a function of supplying part of oxygen to the oxide semiconductor films 92a to 92c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by plasma-enhanced chemical vapor deposition (CVD), sputtering, or the like.

Note that in this specification, oxynitride contains more oxygen than nitrogen, and nitride oxide contains more nitrogen than oxygen.

Note that in the transistor 90 in FIGS. 11A to 11C and FIGS. 12A to 12C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 in FIGS. 11A to 11C and FIGS. 12A to 12C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when it is on and have low off-state current when it is off.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased. Typically, the field-effect mobility is greater than or equal to 10 $cm^2/V \cdot s$ or greater than or equal to 20 $cm^2/V \cdot s$. Note that here, the field-effect mobility is not an approximate value of the mobility as the physical property of the oxide semiconductor film but is an index of current drive capability and the apparent field-effect mobility of a saturation region of the transistor.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, the term "parallel" indicates that an angle formed between two straight lines is −10 to 10°, and accordingly includes the case where the angle is −5 to 5°. The term "substantially parallel" indicates that an angle formed between two straight lines is −30 to 30°. In addition, the term "perpendicular" indicates that an angle formed between two straight lines is 80 to 100°, and accordingly includes the case where the angle is 85 to 95°. The term "substantially perpendicular" indicates that an angle formed between two straight lines is 60 to 120°.

In this specification, trigonal and rhombohedral crystal systems are included in a hexagonal crystal system.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like sputtered particle reaches the substrate, migration occurs on the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn oxide target is made by mixing $InO_x$ powder, $GaO_y$ powder, and $ZnO_z$ powder in a predetermined mole ratio, applying pressure, and performing heat treatment at 1000 to 1500° C. Note that X, Y, and Z are each a given positive number. Here, the predetermined mole ratio of the $InO_x$ powder, the $GaO_y$ powder, and the $ZnO_z$ powder is, for example, 2:2:1, 8:4:3, 3:1:1, 1:1:1, 4:2:3, 2:1:3, or 3:1:2. The kinds of powder and the mole ratio for mixing powder may be changed as appropriate depending on a target to be formed. A CAAC-OS film formed using a target with a mole ratio of In:Ga:Zn=2:1:3 can have a particularly high proportion of regions where a diffraction pattern of CAAC-OS is observed in a predetermined area (proportion of CAAC); thus, a transistor having a channel formation region in the CAAC-OS film can have excellent frequency characteristics.

Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film that is in contact with an oxide semiconductor film is an oxide and Na diffuses into the insulating film. In addition, in the oxide semiconductor film, Na cuts or enters a bond between metal and oxygen that are included in an oxide semiconductor. As a result, for example, degradation in transistor electrical characteristics, such as a normally on state of the transistor due to a shift in the threshold voltage in a negative direction, or a decrease in mobility, occurs. Specifically, the measurement value of a Na concentration by secondary ion mass spectrometry is preferably $5 \times 10^{16}/cm^3$ or less, more preferably $1 \times 10^{16}/cm^3$ or less, still more preferably $1 \times 10^{15}/cm^3$ or less. Similarly, the measurement value of a Li concentration is preferably $5 \times 10^{15}/cm^3$ or less, more preferably $1 \times 10^{15}/cm^3$ or less. Similarly, the measurement value of a K concentration is preferably $5 \times 10^{15}/cm^3$ or less, more preferably $1 \times 10^{15}/cm^3$ or less.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the transistor electrical characteristics are likely to be degraded as in the case of alkali metal or alkaline earth metal. Thus, the concentration of silicon and carbon in the oxide semiconductor film is preferably low. Specifically, the measurement value of a C concentration or the measurement value of a Si concentration by secondary ion mass spectrometry is preferably $1 \times 10^{18}/cm^3$ or less. In that case, the degradation in transistor electrical characteristics can be prevented, so that the reliability of the semiconductor device can be increased.

<Example of Cross-Sectional Structure of Semiconductor Device>

Figure 13:
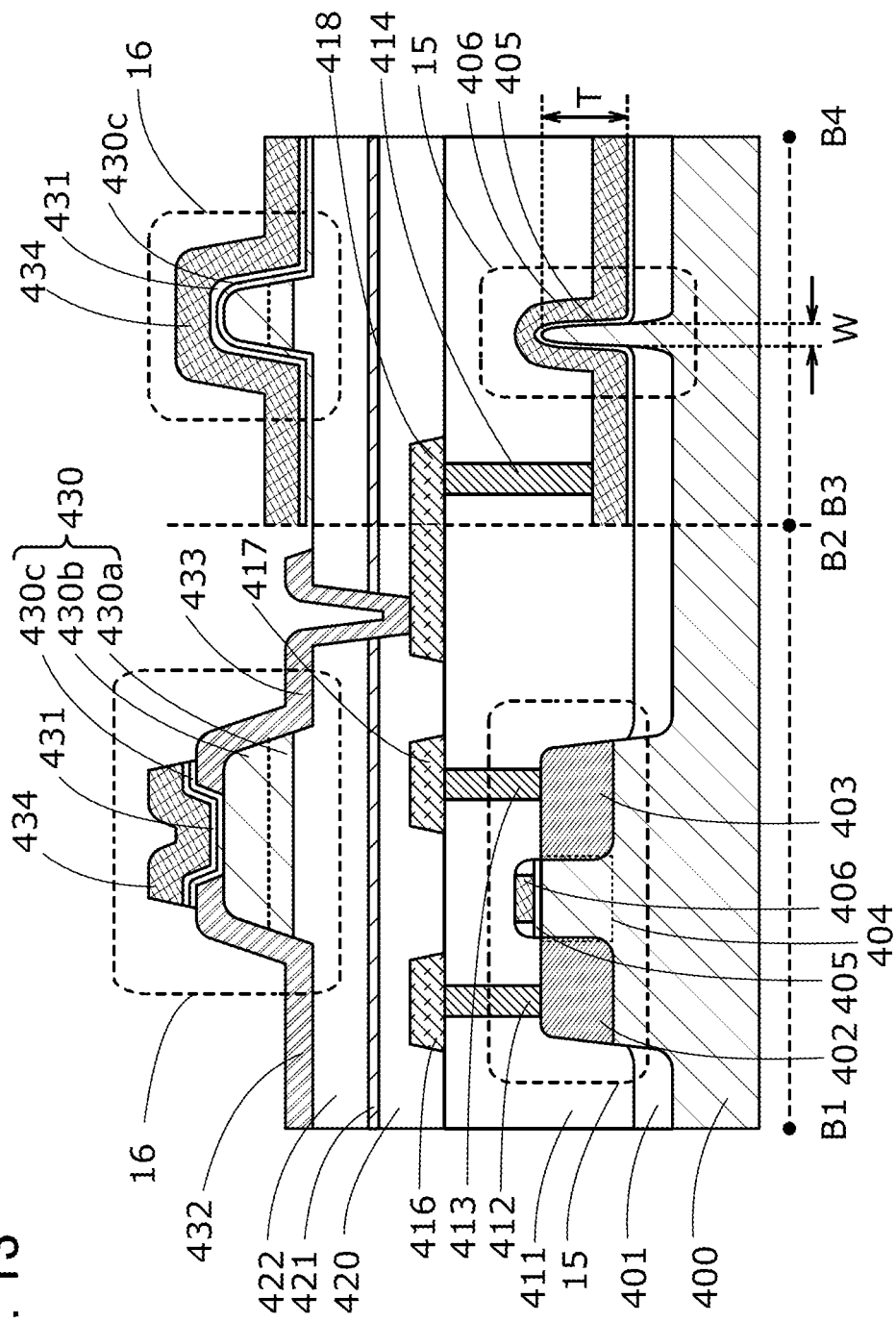
FIG. 13 is a cross-sectional view illustrating an example of a cross-sectional structure of a semiconductor device.

FIG. 13 illustrates a cross-sectional structure example of a semiconductor device according to one embodiment of the present invention. Note that FIG. 13 is a cross-sectional view of the transistor 15, the transistor 16, and the capacitor 17 included in the third circuit component 12 in FIG. 2A. Specifically, the structures of transistors 15 and 16 in a channel length direction are shown in a region indicated by broken line B1-B2, and the structures of the transistors 15 and 16 in a channel width direction are shown in a region indicated by broken line B3-B4. In one embodiment of the present invention, the channel length direction of one transistor is not necessarily aligned with the channel length direction of another transistor.

The channel length direction of a transistor refers to a direction in which carriers move between a source (a source region or a source electrode) and a drain (a drain region or a drain electrode). The channel width direction refers to a direction perpendicular to the channel length direction in a plane parallel to a substrate.

In FIG. 13, the transistor 16 including a channel formation region in an oxide semiconductor film is formed over the transistor 15 including a channel formation region in a single crystal silicon substrate.

A substrate 400 where the transistor 15 is formed can be, for example, a silicon substrate, a germanium substrate, or a silicon germanium substrate. In FIG. 13, a single crystal silicon substrate is used as the substrate 400.

The transistor 15 is electrically isolated by element isolation. Trench isolation (e.g., shallow trench isolation (STI)) or the like can be used as the element isolation. In FIG. 13, the transistor 15 is electrically isolated by trench isolation. Specifically, in FIG. 13, the transistor 15 is electrically isolated by element isolation using an element isolation region 401 formed in such a manner that an insulator including silicon oxide or the like is buried in a trench formed in the substrate 400 by etching or the like and then the insulator is removed partly by etching or the like.

In the case where the transistor 15 has the same conductivity type as the adjacent transistor, element isolation between the adjacent transistors is not necessarily performed. In that case, the layout area can be reduced.

On a projection of the substrate 400 in a region other than the trench, impurity regions 402 and 403 of the transistor 15 and a channel formation region 404 positioned between the impurity regions 402 and 403 are provided. The transistor 15 includes an insulating film 405 covering the channel formation region 404 and a gate electrode 406 overlapping with the channel formation region 404 with the insulating film 405 positioned therebetween.

In the transistor 15, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, the area of the transistor 15 in the substrate can be small, and the amount of transfer of carriers in the transistor 15 can be increased. As a result, the on-state current and field-effect mobility of the transistor 15 are increased. In particular, if the length in the channel width direction (channel width) of the projection in the channel formation region 404 is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of the transistor 15 can be further increased.

Note that in the case of the transistor 15 formed using a bulk semiconductor substrate, the aspect ratio is preferably 0.5 or higher, more preferably 1 or higher.

An insulating film 411 is provided over the transistor 15. Openings are formed in the insulating film 411. In the openings, conductive films 412 and 413 electrically connected to the impurity regions 402 and 403, respectively, and a conductive film 414 electrically connected to the gate electrode 406 are formed.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect of blocking diffusion of oxygen, hydrogen, water, and the like is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, water, and the like can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen, water, and the like can be formed using, for example, silicon nitride or silicon nitride oxide.

An insulating film 422 is provided over the insulating film 421. The transistor 16 is provided over the insulating film 422.

The transistor 16 includes, over the insulating film 422, a semiconductor film 430 including an oxide semiconductor; conductive films 432 and 433 that are electrically connected to the semiconductor film 430 and function as a source electrode and a drain electrode; a gate insulating film 431 covering the semiconductor film 430; and a gate electrode 434 overlapping with the semiconductor film 430 with the gate insulating film 431 positioned therebetween. Note that an opening is provided in the insulating films 420 to 422, and the conductive film 433 is connected to the conductive film 418 through the opening.

Note that in FIG. 13, the transistor 16 includes at least the gate electrode 434 on one side of the semiconductor film 430, and may further include a gate electrode overlapping with the semiconductor film 430 with the insulating film 422 positioned therebetween.

When the transistor 16 includes a pair of gate electrodes, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 13, the transistor 16 has a single-gate structure where one channel formation region corresponding to one gate electrode 434 is provided. However, the transistor 16 may have a multi-gate structure where a plurality of channel formation regions are formed in one active layer by providing a plurality of gate electrodes electrically connected to each other.

As illustrated in FIG. 13, in the transistor 16, the semiconductor film 430 includes oxide semiconductor films 430a to 430c stacked sequentially over the insulating film 422. Note that in one embodiment of the present invention, the semiconductor film 430 of the transistor 16 may be formed using a single-layer metal oxide film.

<Examples of Electronic Device>

A semiconductor device according to one embodiment of the present invention can be used for display devices, personal computers, or image reproducing devices provided with recording media (typically, devices which reproduce the content of recording media such as digital versatile discs (DVD) and have displays for displaying the reproduced images). Other examples of electronic devices that can include the semiconductor device according to one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical equipment. FIGS. 14A to 14F illustrate specific examples of these electronic devices.

Figure 14A:
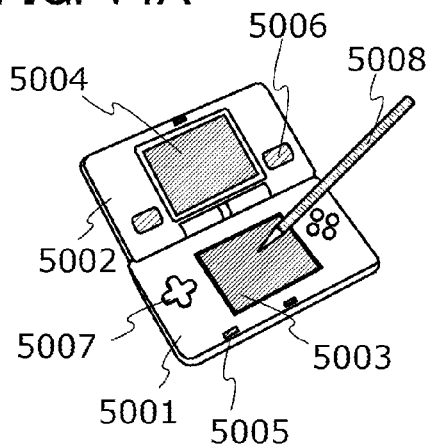
FIGS. 14A to 14F illustrate examples of electronic devices.

FIG. 14A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in portable game machines. Note that although the portable game machine in FIG. 14A includes the two display portions 5003 and 5004, the number of display portions included in the portable game machine is not limited to two.

Figure 14B:
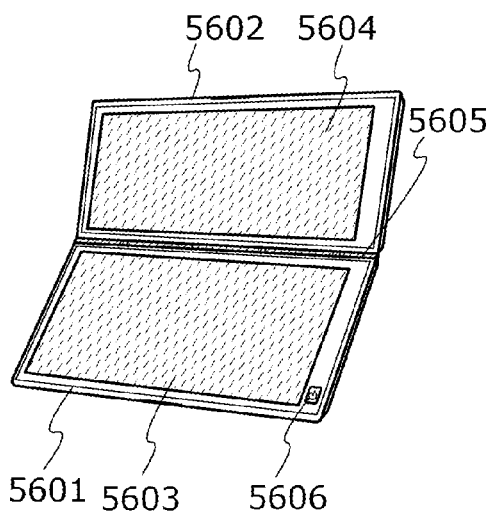

FIG. 14B illustrates a portable information terminal, which includes a first housing 5601, a second housing 5602, a first display portion 5603, a second display portion 5604, a joint 5605, an operation key 5606, and the like. The semiconductor device according to one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image displayed on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added to a display device by providing a touch panel in the display device. Alternatively, the position input function can be added to a display device by providing a photoelectric conversion element called a photosensor in a pixel portion of the display device.

Figure 14C:
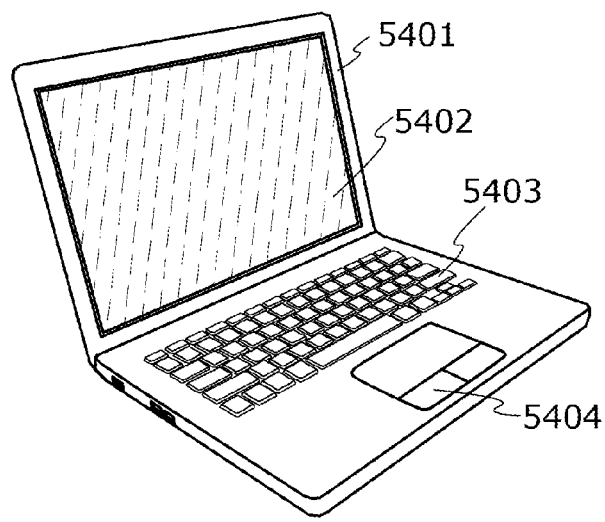

FIG. 14C illustrates a laptop, which includes a housing 5401, a display portion 5402, a keyboard 5403, a pointing device 5404, and the like. The semiconductor device according to one embodiment of the present invention can be used for a variety of integrated circuits included in laptops.

Figure 14D:
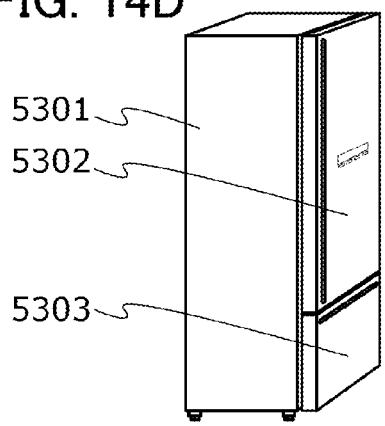

FIG. 14D illustrates an electric refrigerator-freezer, which includes a housing 5301, a refrigerator door 5302, a freezer door 5303, and the like. The semiconductor device according to one embodiment of the present invention can be used for a variety of integrated circuits included in electric refrigerator-freezers.

Figure 14E:
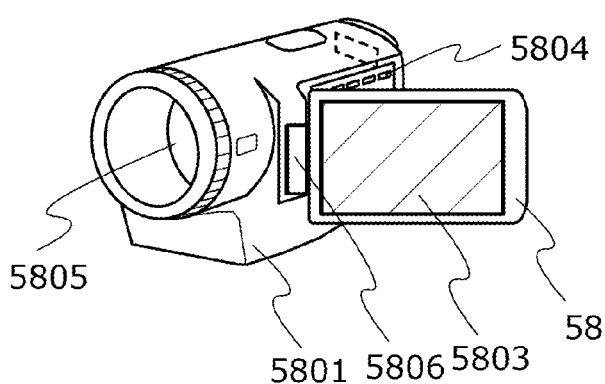

FIG. 14E illustrates a video camera, which includes a first housing 5801, a second housing 5802, a display portion 5803, operation keys 5804, a lens 5805, a joint 5806, and the like. The semiconductor device according to one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image displayed on the display portion 5803 may be switched depending on the angle between the first housing 5801 and the second housing 5802 at the joint 5806.

Figure 14F:
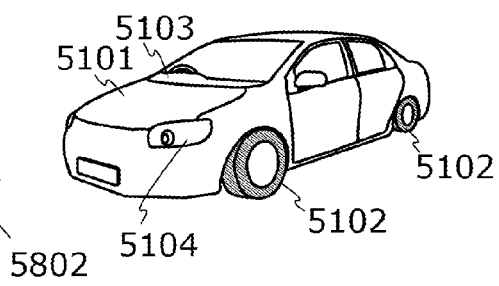

FIG. 14F illustrates an ordinary vehicle, which includes a car body 5101, wheels 5102, a dashboard 5103, lights 5104, and the like. The semiconductor device according to one embodiment of the present invention can be used for a variety of integrated circuits included in ordinary vehicles.

<Others>

For example, in this specification and the like, transistors with a variety of structures can be used, without limitation to a certain type. For example, a transistor including single-crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) obtained by thinning such a semiconductor, or the like can be used. In the case of using the TFT, there are various advantages. For example, since the TFT can be formed at temperature lower than that of the case of using single-crystal silicon, manufacturing cost can be reduced or a manufacturing apparatus can be made large. Since the manufacturing apparatus can be made large, the TFT can be formed using a large substrate. Alternatively, since the manufacturing temperature is low, a substrate having low heat resistance can be used.

Note that by using a catalyst (e.g., nickel) in the case of forming microcrystalline silicon, crystallinity can be further improved and a transistor having excellent electrical characteristics can be formed. In this case, crystallinity can be improved by just performing heat treatment without performing laser irradiation. Note that it is possible to form polycrystalline silicon or microcrystalline silicon without a catalyst (e.g., nickel).

Note that for example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used as a transistor. Alternatively, a thin film transistor obtained by thinning such a compound semiconductor or an oxide semiconductor, or the like can be used. Thus, manufacturing temperature can be lowered and, for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications.

Note that for example, a transistor or the like formed by an inkjet method or a printing method can be used as a transistor. Thus, a transistor can be formed at room temperature, can be formed at a low vacuum, or can be formed using a large substrate. Therefore, the transistor can be formed without the use of a mask (reticle), so that the layout of the transistor can be changed easily. Alternatively, since the transistor can be formed without the use of a resist, material cost is reduced and the number of steps can be reduced. Alternatively, since a film can be formed where needed, a material is not wasted as compared to a manufacturing method by which etching is performed after the film is formed over the entire surface, so that cost can be reduced.

Note that for example, a transistor or the like including an organic semiconductor or a carbon nanotube can be used as a transistor. Thus, such a transistor can be formed over a flexible substrate. A device formed using a transistor including an organic semiconductor or a carbon nanotube can resist shocks.

Note that transistors with a variety of different structures can be used as a transistor. For example, a MOS transistor, a junction transistor, a bipolar transistor, or the like can be used as a transistor. By using a MOS transistor as a transistor, the size of the transistor can be reduced. Thus, a large number of transistors can be mounted. By using a bipolar transistor as a transistor, a large amount of current can flow. Thus, a circuit can be operated at high speed. Note that a MOS transistor and a bipolar transistor may be formed over one substrate. Thus, reduction in power consumption, reduction in size, high-speed operation, and the like can be achieved.

For example, in this specification and the like, an explicit description "X and Y are connected" means that X and Y are electrically connected, X and Y are functionally connected, and X and Y are directly connected. Accordingly, a connection relationship other than those shown in drawings and texts is also included without limitation to a predetermined connection relationship, for example, the connection relationship shown in the drawings and the texts.

Here, each of X, Y, and the like denotes an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a DC-DC converter, a step-up DC-DC converter, or a step-down DC-DC converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a storage circuit; and/or a control circuit) can be connected between X and Y. When a signal output from X is transmitted to Y, it can be said that X and Y are functionally connected even if another circuit is provided between X and Y.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "X and Y are electrically connected" is the same as an explicit simple expression "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

The current source has a function of supplying constant current even when the magnitude of voltage applied to both ends of the current source is changed, or the current source has a function of supplying constant current to an element connected to the current source even when the potential of the element is changed, for example.

Note that there is a voltage source as a power source different from a current source. The voltage source has a function of supplying constant voltage even when current flowing through a circuit connected to the voltage source is changed. Accordingly, the voltage source and the current source each have a function of supplying voltage and current. However, the function of the voltage source and the function of the current source are different in what is supplied at a constant level even when one factor is changed. The current source has a function of supplying constant current event when voltage across both ends is changed. The voltage source has a function of supplying constant voltage even when current is changed.

This application is based on Japanese Patent Application serial No. 2014-043885 filed with Japan Patent Office on Mar. 6, 2014, the entire contents of which are hereby incorporated by reference.

What is claimed is:
1. A voltage controlled oscillator comprising:
($2n$+1) first circuit components, where n is an integer of one or more,
wherein an output terminal of the first circuit component in a k-th stage is connected to an input terminal of the first circuit component in a (k+1)-th stage, where k is an integer of one or more and $2n$ or less, wherein an output terminal of the first circuit component in a $(2n+1)$th stage is connected to an input terminal of the first circuit component in a first stage, wherein one of the first circuit components includes a second circuit component including any of an inverter, a NAND circuit, and a NOR circuit and a third circuit component whose input terminal is connected to an output terminal of the second circuit component, wherein the third circuit component includes a first transistor and a second transistor whose source-drain resistance is controlled in accordance with a signal input to a gate of the second transistor through the first transistor, and wherein the first transistor includes a channel formation region in an oxide semiconductor film and the second transistor includes a channel formation region in a semiconductor substrate.

2. The voltage controlled oscillator according to claim 1, wherein the oxide semiconductor film includes indium, gallium, and zinc.

3. A semiconductor device comprising:
the voltage controlled oscillator according to claim 1; and
a logic circuit.

4. An electronic device comprising:
the voltage controlled oscillator according to claim 1; and
a display device.

5. The voltage controlled oscillator according to claim 1, wherein the voltage controlled oscillator maintains to oscillate even after the first transistor is switched from on to off.

6. The voltage controlled oscillator according to claim 1, wherein a potential of the gate of the second transistor is held after the first transistor is switched from on to off.

7. A voltage controlled oscillator comprising:
$(2n+1)$ first circuit components, where $n$ is an integer of one or more, wherein an output terminal of the first circuit component in a k-th stage is connected to an input terminal of the first circuit component in a (k+1)-th stage, where k is an integer of one or more and $2n$ or less, wherein an output terminal of the first circuit component in a $(2n+1)$-th stage is connected to an input terminal of the first circuit component in a first stage, wherein one of the first circuit components includes a second circuit component including any of an inverter, a NAND circuit, and a NOR circuit and a third circuit component whose input terminal is connected to an output terminal of the second circuit component, wherein the third circuit component includes a first transistor, a second transistor whose source-drain resistance is controlled in accordance with a signal input to a gate of the second transistor through the first transistor, and a capacitor including an electrode connected to the gate of the second transistor, and wherein the first transistor includes a channel formation region in an oxide semiconductor film and the second transistor includes a channel formation region in a semiconductor substrate.

8. The voltage controlled oscillator according to claim 7, wherein the oxide semiconductor film includes indium, gallium, and zinc.

9. A semiconductor device comprising:
the voltage controlled oscillator according to claim 7; and
a logic circuit.

10. An electronic device comprising:
the voltage controlled oscillator according to claim 7; and
a display device.

11. The voltage controlled oscillator according to claim 7, wherein the voltage controlled oscillator maintains to oscillate even after the first transistor is switched from on to off.

12. The voltage controlled oscillator according to claim 7, wherein a potential of the gate of the second transistor is held after the first transistor is switched from on to off.

13. A voltage controlled oscillator comprising:
$(2n+1)$ first circuit components, where n is an integer of one or more, wherein an output terminal of the first circuit component in a k-th stage is connected to an input terminal of the first circuit component in a (k+1)-th stage, where k is an integer of one or more and $2n$ or less, wherein an output terminal of the first circuit component in a $(2n+1)$th stage is connected to an input terminal of the first circuit component in a first stage, wherein one of the first circuit components includes a second circuit component including any of an inverter, a NAND circuit, and a NOR circuit and a third circuit component whose input terminal is connected to an output terminal of the second circuit component, wherein the third circuit component includes a first transistor and a second transistor having a gate connected to one of a source and a drain of the first transistor, and wherein the first transistor includes a channel formation region in an oxide semiconductor film and the second transistor includes a channel formation region in a semiconductor substrate.

14. The voltage controlled oscillator according to claim 13, wherein the oxide semiconductor film includes indium, gallium, and zinc.

15. A semiconductor device comprising:
the voltage controlled oscillator according to claim 13; and
a logic circuit.

16. An electronic device comprising:
the voltage controlled oscillator according to claim 13; and
a display device.

17. The voltage controlled oscillator according to claim 13, wherein the voltage controlled oscillator maintains to oscillate even after the first transistor is switched from on to off.

18. The voltage controlled oscillator according to claim 13, wherein a potential of the gate of the second transistor is held after the first transistor is switched from on to off.

19. A voltage controlled oscillator comprising:
$(2n+1)$ first circuit components, where n is an integer of one or more, wherein an output terminal of the first circuit component in a k-th stage is connected to an input terminal of the first circuit component in a (k+1)-th stage, where k is an integer of one or more and $2n$ or less, wherein an output terminal of the first circuit component in a $(2n+1)$-th stage is connected to an input terminal of the first circuit component in a first stage, wherein one of the first circuit components includes a second circuit component including any of an inverter, a NAND circuit, and a NOR circuit and a third circuit component whose input terminal is connected to an output terminal of the second circuit component, wherein the third circuit component includes a first transistor, a second transistor having a gate connected to one of a source and a drain of the first transistor, and a capacitor including an electrode connected to the gate of the second transistor, and wherein the first transistor includes a channel formation region in an oxide semiconductor film and the second transistor includes a channel formation region in a semiconductor substrate.

20. The voltage controlled oscillator according to claim 19, wherein the oxide semiconductor film includes indium, gallium, and zinc.

21. A semiconductor device comprising:
the voltage controlled oscillator according to claim 19; and
a logic circuit.

22. An electronic device comprising:
the voltage controlled oscillator according to claim 19; and
a display device.

23. The voltage controlled oscillator according to claim 19, wherein the voltage controlled oscillator maintains to oscillate even after the first transistor is switched from on to off.

24. The voltage controlled oscillator according to claim 19, wherein a potential of the gate of the second transistor is held after the first transistor is switched from on to off.

* * * * *